(12) United States Patent
Lei et al.

(10) Patent No.: US 8,937,835 B2
(45) Date of Patent: Jan. 20, 2015

(54) NON-VOLATILE STORAGE WITH READ PROCESS THAT REDUCES DISTURB

(71) Applicant: Sandisk Technologies Inc., Plano, TX (US)

(72) Inventors: Bo Lei, San Ramon, CA (US); Jun Wan, San Jose, CA (US); Feng Pan, San Jose, CA (US)

(73) Assignee: Sandisk Technologies Inc., Plano, TX (US)

( * ) Notice: Subject to any disclaimer, the term of this patent is extended or adjusted under 35 U.S.C. 154(b) by 74 days.

(21) Appl. No.: 13/783,781

(22) Filed: Mar. 4, 2013

(65) Prior Publication Data

US 2013/0242661 A1     Sep. 19, 2013

Related U.S. Application Data

(60) Provisional application No. 61/610,387, filed on Mar. 13, 2012.

(51) Int. Cl.
| | |
|---|---|
| *G11C 11/34* | (2006.01) |
| *G11C 16/26* | (2006.01) |
| *G11C 11/56* | (2006.01) |
| *G11C 16/34* | (2006.01) |

(52) U.S. Cl.
CPC ............ *G11C 16/26* (2013.01); *G11C 11/5642* (2013.01); *G11C 16/3427* (2013.01)
USPC ................................. 365/185.17; 365/185.24

(58) Field of Classification Search
CPC ...................................................... G11C 16/26
USPC ........................................ 365/185.17, 185.24
See application file for complete search history.

(56) References Cited

U.S. PATENT DOCUMENTS

| | | | |
|---|---|---|---|
| 7,468,919 B2 | 12/2008 | Sekar | |
| 8,023,327 B2 | 9/2011 | Futatsuyama | |
| 8,315,103 B2* | 11/2012 | Lee et al. | 365/185.2 |
| 8,737,134 B2* | 5/2014 | Shiino et al. | 365/185.2 |
| 2008/0049508 A1 | 2/2008 | Iwai | |
| 2009/0238003 A1 | 9/2009 | Makimi | |
| 2010/0067299 A1 | 3/2010 | Futatsuyama | |
| 2011/0317489 A1* | 12/2011 | Kim et al. | 365/185.18 |
| 2012/0163096 A1* | 6/2012 | Futatsuyama et al. | 365/185.22 |

OTHER PUBLICATIONS

PCT International Search Report dated Jul. 4, 2013, PCT Patent Application No. PCT/US2013/029991.
PCT Written Opinion of the International Searching Authority dated Jul. 4, 2013, PCT Patent Application No. PCT/US2013/029991.

* cited by examiner

*Primary Examiner* — Michael Tran
(74) *Attorney, Agent, or Firm* — Vierra Magen Marcus LLP

(57) ABSTRACT

A apparatus and process for reading data from non-volatile storage includes applying a read compare signal to a selected data memory cell of a NAND string, applying a first set of one or more read pass voltages to unselected data memory cells at both ends of the NAND string and applying a second set of one or more read pass voltages to unselected data memory cells between both ends of the NAND string and on both sides of the selected data memory cell. The second set of one or more read pass voltages are all higher than the first set of one or more read pass voltages.

12 Claims, 24 Drawing Sheets

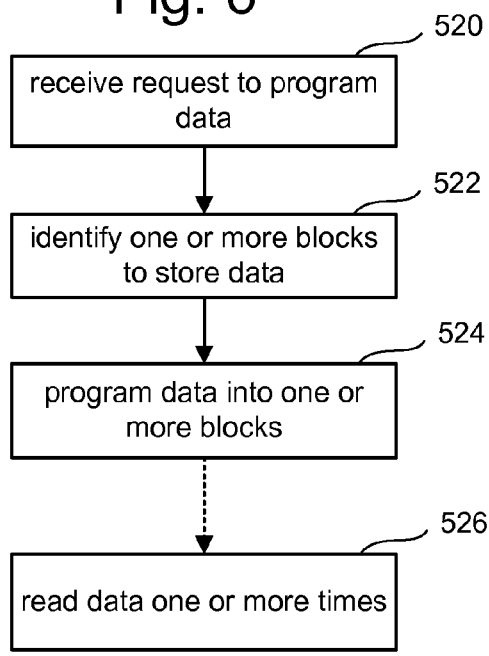
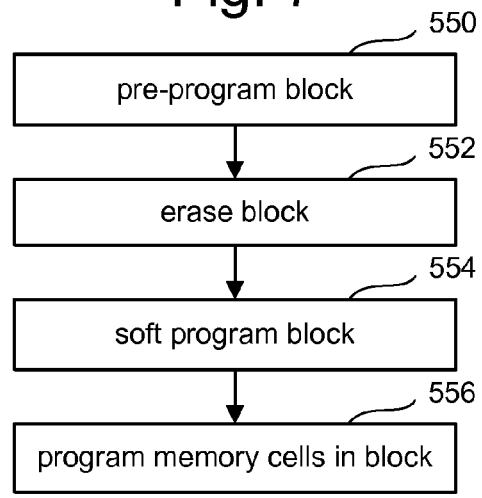

NON-VOLATILE STORAGE WITH READ PROCESS THAT REDUCES DISTURB

This application claims the benefit of U.S. Provisional Application 61/610,387, filed on Mar. 13, 2012, incorporated herein by reference in its entirety.

BACKGROUND OF THE INVENTION

1. Field of the Invention

The present invention relates to technology for non-volatile storage.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in the programmed state. More information about programming can be found in U.S. Pat. No. 6,859,397, titled "Source Side Self Boosting Technique For Non-Volatile Memory;" and U.S. Pat. No. 6,917,542, titled "Detecting Over Programmed Memory," both patents are incorporated herein by reference in their entirety.

Some EEPROM and flash memory devices have a floating gate that is used to store two ranges of charges and, therefore, the memory cell can be programmed/erased between two states, an erased state and a programmed state that correspond to data "1" and data "0." Such a device is referred to as a binary or two-state device.

A multi-state flash memory cell is implemented by identifying multiple, distinct allowed threshold voltage ranges. Each distinct threshold voltage range corresponds to a predetermined value for the set of data bits. The specific relationship between the data programmed into the memory cell and the threshold voltage ranges of the memory cell depends upon the data encoding scheme adopted for the memory cells. For example, U.S. Pat. No. 6,222,762 and U.S. Patent Application Publication No. 2004/0255090, both of which are incorporated herein by reference in their entirety, describe various data encoding schemes for multi-state flash memory cells.

Typically, the program voltage (Vpgm) is applied to the control gates of the memory cells as a series of pulses. The magnitude of the pulses is increased with each successive pulse by a predetermined step size (e.g. 0.2 v, 0.3 v, 0.4 v, or others). In the periods between the pulses, verify operations are carried out. That is, the programming level of each memory cell of a group of memory cells being programmed in parallel is sensed between each programming pulse to determine whether it is equal to or greater than a verify level to which it is being programmed. One means of verifying the programming is to test conduction at a specific compare point. The memory cells that are verified to be sufficiently programmed are locked out, for example, by raising the bit line voltage to stop the programming process for those memory cells. The above described techniques, and others described herein, can be used in combination with various boosting techniques to prevent program disturb and with various efficient verify techniques known in the art.

Memory cells can be read by separately applying one or more compare voltages to the control gate (or other terminal) of the memory cell and sensing whether the memory cell conduct sufficient current in response to the compare voltage. In these read operations, unselected word lines are raised to a read pass voltage (e.g. 7-10 volts) to make the associated transistors operate as pass gates. The selected word line is connected to a voltage, a level of which is specified for each read operation, in order to determine whether a threshold voltage of the concerned memory cell has reached such level. Because the unselected word lines receive the pass voltage, memory cells along unselected word lines during a read operation will receive a voltage on their control gate which over many read operations may cause electrons to be injected into their floating gate, thereby, raising the threshold voltage of those memory cells. This effect is called Read Disturb.

BRIEF DESCRIPTION OF THE DRAWINGS

FIG. 6 is a flow chart describing one embodiment of a process for programming.

FIG. 7 is a flow chart describing one embodiment of a process for programming data into a block of memory cells.

DETAILED DESCRIPTION

A system is disclosed for reading data from non-volatile storage in a manner that reduces the chance of read disturb occurring. One set of embodiments includes applying a first set of one or more read pass voltages to unselected data memory cells at both ends of the NAND string and applying a second set of one or more read pass voltages to unselected data memory cells between both ends of the NAND string and on both sides of the selected data memory cell. The second set of one or more read pass voltages are all higher than the first set of one or more read pass voltages.

Figure 1:
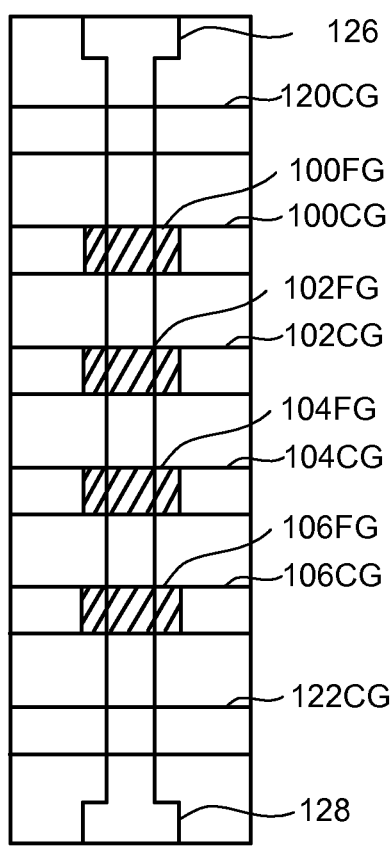
FIG. 1 is a top view of a NAND string.
Figure 2:
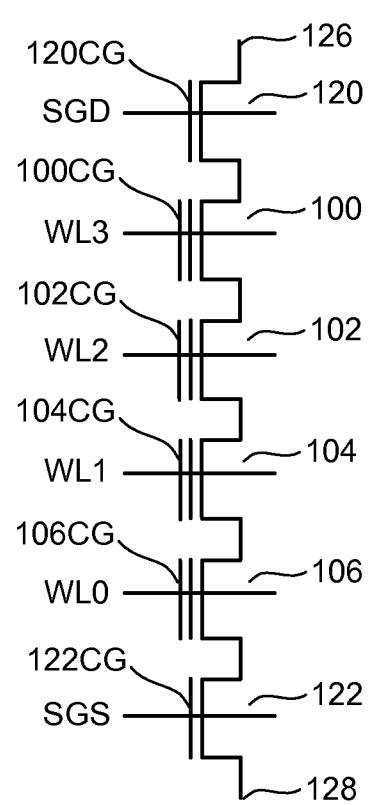
FIG. 2 is an equivalent circuit diagram of the NAND string.

One example of a non-volatile storage system that can implement the technology described herein is a flash memory system that uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between (drain side) select gate 120 and (source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four memory cells is only provided as an example. A NAND string can have less than four memory cells or more than four memory cells. For example, some NAND strings will have 128 memory cells or more. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND structure will include several NAND strings. Each NAND string is connected to the common source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to a sense amplifier.

Relevant examples of NAND type flash memories and their operation are provided in the following U.S. Patents/Patent Applications, all of which are incorporated herein by reference in their entirety: U.S. Pat. No. 5,570,315; U.S. Pat. No. 5,774,397; U.S. Pat. No. 6,046,935; U.S. Pat. No. 6,456,528; and U.S. Pat. Publication No. US2003/0002348.

Other types of non-volatile storage devices, in addition to NAND flash memory, can also be used to implement the new technology described herein. For example, a TANOS structure (consisting of a stacked layer of TaN—$Al_2O_3$—SiN—$SiO_2$ on a silicon substrate), which is basically a memory cell using trapping of charge in a nitride layer (instead of a floating gate), can also be used with the technology described herein. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor.

Another example is described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. U.S. Pat. Nos. 5,768,192 and 6,011,725 disclose a non-volatile memory cell having a trapping dielectric sandwiched between two silicon dioxide layers. Multi-state data storage is implemented by separately reading the binary states of the spatially separated charge storage regions within the dielectric. Other types of non-volatile memory technologies can also be used.

Figure 3:
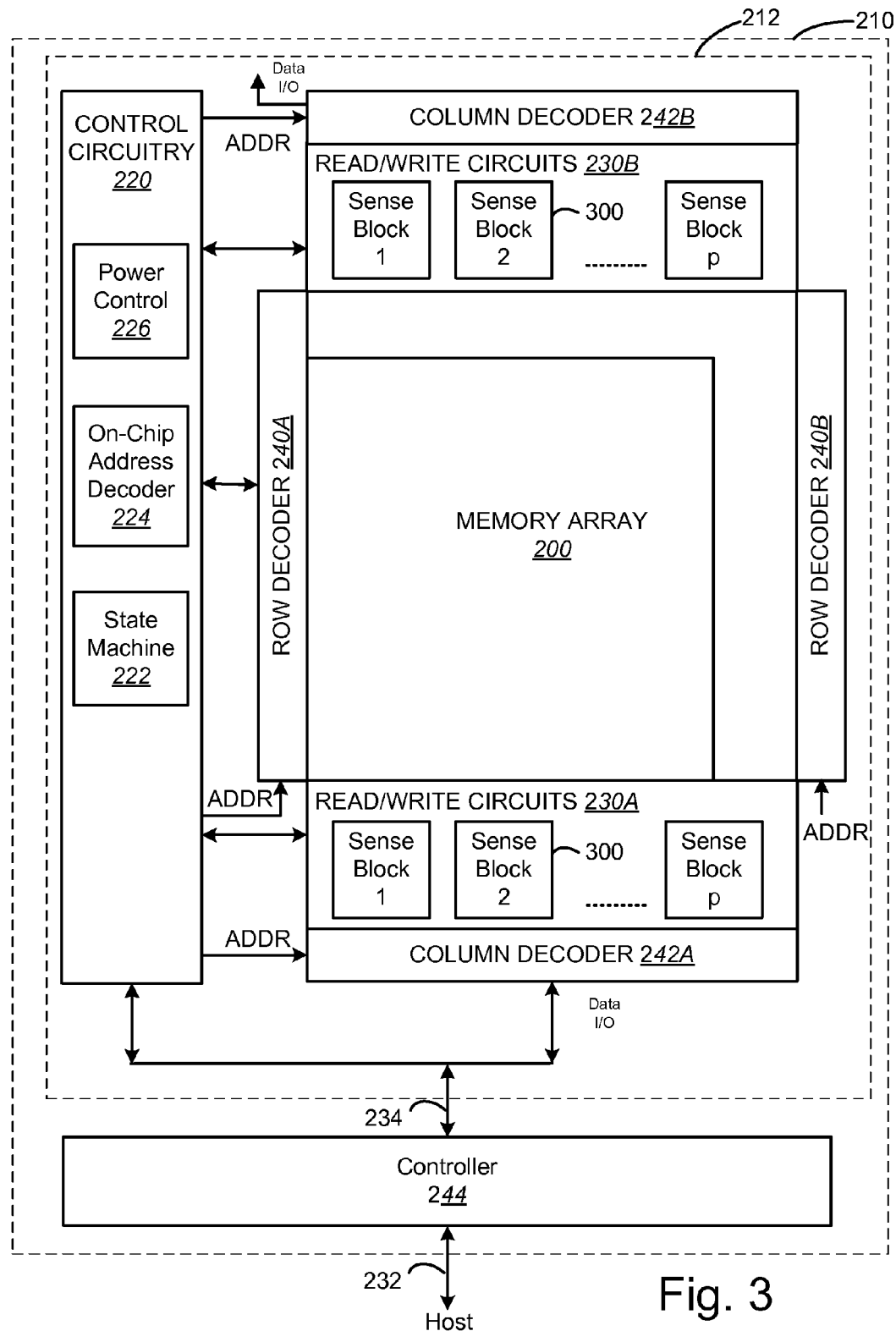
FIG. 3 is a block diagram of a non-volatile memory system.

FIG. 3 illustrates a memory device 210 having read/write circuits for reading and programming a page of memory cells (e.g., NAND multi-state flash memory) in parallel. Memory device 210 may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234. Some memory systems may include multiple dies 212 in communication with Controller 244.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface between that used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage. Control circuitry 220, power control 226, decoder 224, state machine 222, decoders 240 A/B & 242A/B, the read/write circuits 230A/B and the controller 244, collectively or separately, can be referred to as one or more managing circuits.

Figure 4:
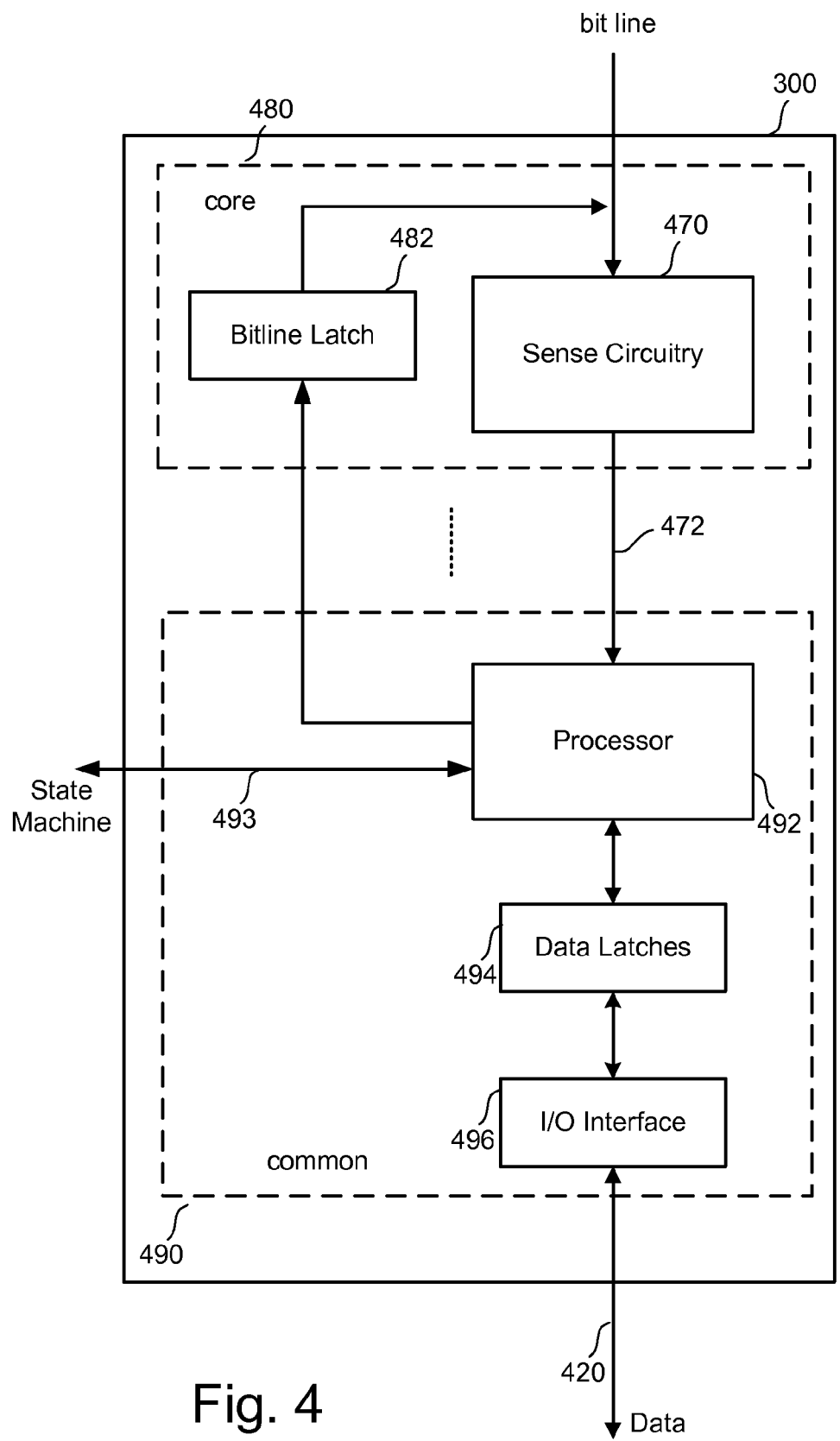
FIG. 4 is a block diagram depicting one embodiment of a sense block.

FIG. 4 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. For further details, refer to U.S. Patent Application Publication 2006/0140007, which is incorporated herein by reference in its entirety.

Sense module 480 comprises sense circuitry 470 that determines whether a conduction current in a connected bit line is above or below a predetermined level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls the supply of different control gate voltages to the addressed cell. As it steps through the various predefined control gate voltages (the read reference voltages or the verify reference voltages) corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 4) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time. In some embodiments that have many sense modules, the wired-OR lines of the many sense modules can be grouped in sets of N sense modules, and the groups can then be grouped to form a binary tree.

During program or verify, the data to be programmed is stored in the set of data latches 494 from the data bus 420. The program operation, under the control of the state machine, comprises a series of programming voltage pulses (with increasing magnitudes) concurrently applied to the control gates of the addressed memory cells to that the memory cells are programmed at the same time. Each programming pulse is followed by a verify process to determine if the memory cell has been programmed to the desired state. Processor 492 monitors the verified memory state relative to the desired memory state. When the two are in agreement, processor 492 sets the bit line latch 482 so as to cause the bit line to be pulled to a state designating program inhibit. This inhibits the memory cell coupled to the bit line from further programming even if it is subjected to programming pulses on its control gate. In other embodiments the processor initially loads the bit line latch 482 and the sense circuitry sets it to an inhibit value during the verify process.

Data latch stack 494 contains a stack of data latches corresponding to the sense module. In one embodiment, there are three (or four or another number) data latches per sense module 480. In some implementations (but not required), the data latches are implemented as a shift register so that the parallel data stored therein is converted to serial data for data bus 420, and vice versa. In one preferred embodiment, all the data latches corresponding to the read/write block of memory cells can be linked together to form a block shift register so that a block of data can be input or output by serial transfer. In particular, the bank of read/write modules is adapted so that each of its set of data latches will shift data into or out of the data bus in sequence as if they are part of a shift register for the entire read/write block.

Additional information about the structure and/or operations of various embodiments of non-volatile storage devices can be found in (1) United States Patent Application Pub. No. 2004/0057287, "Non-Volatile Memory And Method With Reduced Source Line Bias Errors," published on Mar. 25, 2004; (2) United States Patent Application Pub No. 2004/0109357, "Non-Volatile Memory And Method with Improved Sensing," published on Jun. 10, 2004; (3) U.S.

Patent Application Pub. No. 20050169082; (4) U.S. Patent Application Pub. 2006/0221692, titled "Compensating for Coupling During Read Operations of Non-Volatile Memory," Inventor Jian Chen, filed on Apr. 5, 2005; and (5) U.S. Patent Application Pub. 2006/0158947, titled "Reference Sense Amplifier For Non-Volatile Memory, Inventors Siu Lung Chan and Raul-Adrian Cernea, filed on Dec. 28, 2005. All five of the immediately above-listed patent documents are incorporated herein by reference in their entirety.

Figure 5:
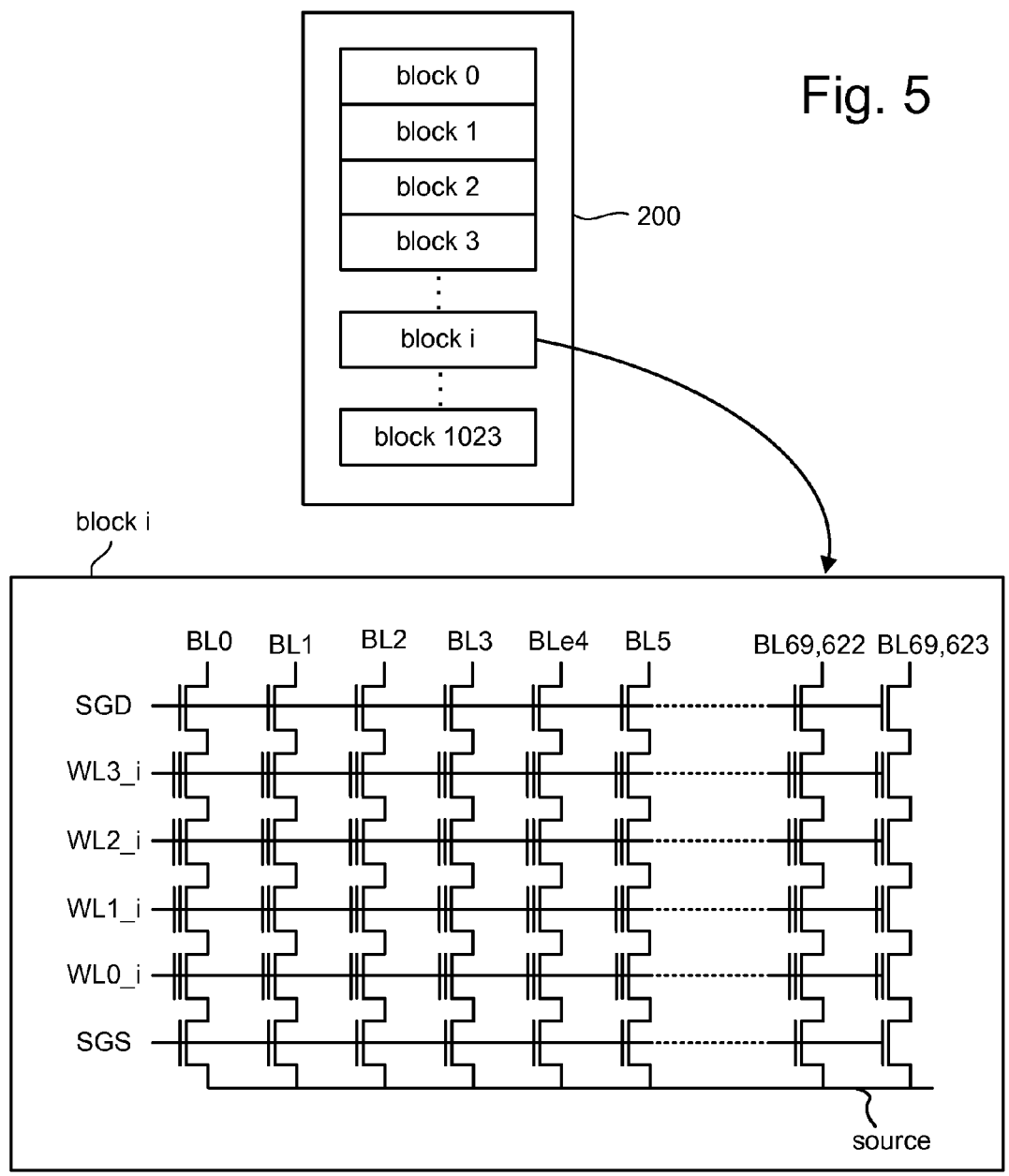
FIG. 5 is a block diagram depicting one embodiment of a memory array.

FIG. 5 depicts an exemplary structure of memory cell array 200. In one embodiment, the array of memory cells is divided into a large number of blocks of memory cells. As is common for flash EEPROM systems, the block is the unit of erase. That is, each block contains the minimum number of memory cells that are erased together. Other embodiments can use different units of erase.

As one example, the NAND flash EEPROM depicted in FIG. 5 is partitioned into 1,024 blocks. However, more or less than 1024 blocks can be used. In each block, in this example, there are 69,624 columns corresponding to bit lines BL0, BL1, ... BL69,623. In one embodiment, all of the bit lines of a block can be simultaneously selected during read and program operations. Memory cells along a common word line and connected to any bit line can be programmed (or read) at the same time (e.g., concurrently). In another embodiment, the bit lines are divided into even bit lines and odd bit lines. In an odd/even bit line architecture, memory cells along a common word line and connected to the odd bit lines are programmed at one time, while memory cells along a common word line and connected to even bit lines are programmed at another time.

FIG. 5 shows four memory cells connected in series to form a NAND string. Although four cells are shown to be included in each NAND string, more or less than four can be used (e.g., 16, 32, 64, 128 or another number or memory cells can be on a NAND string). One terminal of the NAND string is connected to a corresponding bit line via a drain select gate (connected to select gate drain line SGD), and another terminal is connected to the source line via a source select gate (connected to select gate source line SGS).

Each block is typically divided into a number of pages. In one embodiment, a page is a unit of programming. One or more pages of data are typically stored in one row of memory cells. A page can store one or more sectors. A sector includes user data and overhead data. Overhead data typically includes an Error Correction Code (ECC) that has been calculated from the user data of the sector. The controller calculates the ECC when data is being programmed into the array, and also checks it when data is being read from the array. In some embodiments, the state machine, controller, or other component can calculate and check the ECC. In some alternatives, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. In one embodiment, each word line of a block is associated with one page. In another embodiment, each word line of a block is associated with 3 pages. In other embodiments, the word lines can be associate with other numbers of pages.

Some memory cells are slower to program or erase than others because of manufacturing variations among those memory cells, because those cells were previously erased to a lower threshold voltage than others, because of uneven wear among the cells within a page, or other reasons. And, of course, some memory cells cannot be programmed or erased whatsoever, because of a defect or other reason. Additionally, some memory cells program fast and can be over programmed, which may also cause an error. As mentioned above, error correction coding provides the capability of tolerating some number of failed cells, while still maintaining the memory as usable. In some applications, a page of data is programmed by repeatedly applying programming pulses until all memory cells on that page verify to the desired programmed state. In some implementation, programming and erasing time is saved by terminating the sequence of programming or erasing pulses when the number of error memory cells that are not yet fully programmed or erased is fewer than the number of bits that are correctable.

FIG. 6 is a flow chart describing one embodiment of a process for programming. In step 520, a request for programming is received from the Host, the Controller or other entity. In step 522, the Controller (or state machine or other entity) will determine which set of one or more blocks to store the data. In step 524, the data received for the request is programmed into one or more blocks of memory cells. In step 526, the data can be read. The dashed line between steps 524 and 526 indicates that there can be an unpredictable amount of time between programming and reading.

FIG. 7 is a flow chart describing a process for programming a block of memory. The process of FIG. 7 is performed one or more times during step 524 of FIG. 6. In one example implementation, memory cells are pre-programmed in order to maintain even wear on the memory cells (step 550). In one embodiment, the memory cells are preprogrammed to the highest data state, a random pattern, or any other pattern. In some implementations, pre-programming need not be performed. Some embodiments do not implement pre-programming.

In step 552, memory cells are erased (in blocks or other units) prior to programming. Memory cells are erased in one embodiment by raising the p-well to an erase voltage (e.g., 20 volts) for a sufficient period of time and grounding the word lines of a selected block while the source and bit lines are floating. In blocks that are not selected to be erased, word lines are floated. Due to capacitive coupling, the unselected word lines, bit lines, select lines, and the common source line are also raised to a significant fraction of the erase voltage thereby impeding erase on blocks that are not selected to be erased. In blocks that are selected to be erased, a strong electric field is applied to the tunnel oxide layers of selected memory cells and the selected memory cells are erased as electrons of the floating gates are emitted to the substrate side, typically by Fowler-Nordheim tunneling mechanism. As electrons are transferred from the floating gate to the p-well region, the threshold voltage of a selected cell is lowered. Erasing can be performed on the entire memory array, on individual blocks, or another unit of memory cells. In one embodiment, after erasing the memory cells, all of the erased memory cells in the block will be in state S0 (discussed below). One implementation of an erase process includes applying several erase pulses to the p-well and verifying between erase pulses whether the NAND strings are properly erased.

In step 554, soft programming is (optionally) performed to narrow the distribution of erased threshold voltages for the erased memory cells. Some memory cells may be in a deeper erased state than necessary as a result of the erase process. Soft programming can apply programming pulses to move the threshold voltage of the deeper erased memory cells to the erase threshold distribution. In step 556, the memory cells of the block are programmed. The programming can be performed in response to a request to program from the host, or in response to an internal process. After programming, the memory cells of the block can be read. Many different read processes known in the art can be used to read data. In some embodiments, the read process includes using ECC to correct errors. The data that is read is output to the hosts that requested the read operation. The ECC process can be performed by the state machine, the controller or another device. The erase-program cycle can happen many times without or independent of reading, the read process can occur many times without or independent of programming and the read process can happen any time after programming. The process of FIG. 7 can be performed at the direction of the state machine using the various circuits described above. In other embodiments, the process of FIG. 7 can be performed at the direction of the Controller using the various circuits described above.

Figure 8:
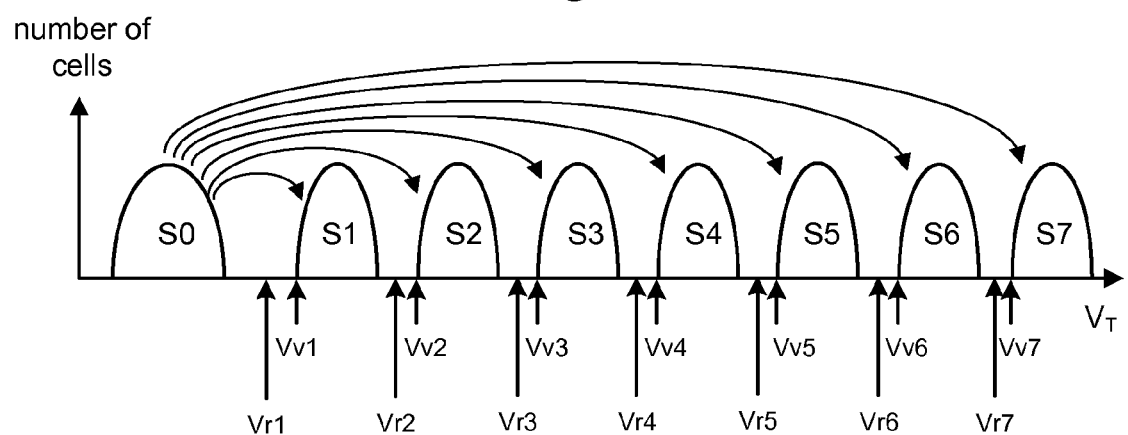
FIG. 8 depicts an example set of threshold voltage distributions and describes a process for programming non-volatile memory.

At the end of a successful programming process (with verification), the threshold voltages of the memory cells should be within one or more distributions of threshold voltages for programmed memory cells or within a distribution of threshold voltages for erased memory cells, as appropriate. FIG. 8 illustrates example threshold voltage distributions for the memory cell array when each memory cell stores three bits of data. Other embodiments, however, may use more or less than three bits of data per memory cell (e.g., such as three bits of data per memory cell).

In the example of FIG. 8, each memory cell stores three bits of data; therefore, there are eight valid threshold voltage distributions, also called data states: S0, S1, S2, S3, S4, S5, S6 and S7. In one embodiment, data state S0 is below 0 volts and data states S1-S7 are above 0 volts. In other embodiments, all eight data states are above 0 volts, or other arrangements can be implemented. In one embodiment, the threshold voltage distribution for S0 is wider than for S1-S7. In one embodiment, S0 is for erased memory cells. Data is programmed from S0 to S1-S7.

Each data state corresponds to a unique value for the three data bits stored in the memory cell. In one embodiment, S0=111, S1=110, S2=101, S3=100, S4=011, S5=010, S6=001 and S7=000. Other mapping of data to states S0-S7 can also be used. The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, "Tracking Cells For A Memory System," filed on Jun. 13, 2003, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring threshold voltage distribution, only one bit will be affected. However, in other embodiments, Gray code is not used.

In one embodiment, all of the bits of data stored in a memory cell are stored in the same logical page. In other embodiments, each bit of data stored in a memory cell corresponds to different logical pages. Thus, a memory cell storing three bits of data would include data in a first page, data in a second page and data in a third page. In some embodiments, all of the memory cells connected to the same word line would store data in the same three pages of data. In some embodiments, the memory cells connected to a word line can be grouped into different sets of pages (e.g., by odd and even bit lines, or by other arrangements).

In some devices, the memory cells will be erased to state S0. From state S0, the memory cells can be programmed to any of states S1-S7. In one embodiment, known as full sequence programming, memory cells can be programmed from the erased state S0 directly to any of the programmed states S1-S7. For example, a population of memory cells to be programmed may first be erased so that all memory cells in the population are in erased state S0. While some memory cells are being programmed from state S0 to state S1, other memory cells are being programmed from state S0 to state S2, state S0 to state S3, state S0 to state S4, state S0 to state S5, state S0 to state S6, and state S0 to state S7. Full sequence programming is graphically depicted by the seven curved arrows of FIG. 8.

FIG. 8 shows a set of verify target levels Vv1, Vv2, Vv3, Vv4, Vv5, Vv6, and Vv7. These verify levels are used as comparison levels (also known as target levels) during the programming process. For example, when programming memory cells to state S1, the system will check to see if the threshold voltages of the memory cells have reached Vv1. If the threshold voltage of a memory cell has not reached Vv1, then programming will continue for that memory cell until its threshold voltage is greater than or equal to Vv1. If the threshold voltage of a memory cell has reached Vv1, then programming will stop for that memory cell. Verify target level Vv2 is used for memory cells being programmed to state S2. Verify target level Vv3 is used for memory cells being programmed to state S3. Verify target level Vv4 is used for memory cells being programmed to state S4. Verify target level Vv5 is used for memory cells being programmed to state S5. Verify target level Vv6 is used for memory cells being programmed to state S6. Verify target level Vv7 is used for memory cells being programmed to state S7.

FIG. 8 also shows a set of read compare levels Vr1, Vr2, Vr3, Vr4, Vr5, Vr6, and Vr7. These read compare levels are used as comparison levels during the read process. By testing whether the memory cells turn on or remain off in response to the read compare levels Vr1, Vr2, Vr3, Vr4, Vr5, Vr6, and Vr7 being separately applied to the control gates of the memory cells, the system can determine which states that memory cells are storing data for.

In general, during verify operations and read operations, the selected word line is connected to a voltage, a level of which is specified for each read operation (e.g., see read compare levels Vr1, Vr2, Vr3, Vr4, Vr5, Vr6, and Vr7 of FIG. 8) or verify operation (e.g. see verify target levels Vv1, Vv2, Vv3, Vv4, Vv5, Vv6, and Vv7 of FIG. 8) in order to determine whether a threshold voltage of the concerned memory cell has reached such level. After applying the word line voltage, the conduction current of the memory cell is measured to determine whether the memory cell turned on in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier that is in communication with the bit line. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. More information about verifying/reading can be found in the following patent documents that are incorporated herein by reference in their entirety: (1) United States Patent Application Pub. No. 2004/0057287; (2) United States Patent Application Pub No. 2004/0109357; (3) U.S. Patent Application Pub. No. 2005/0169082; and (4) U.S. Patent Application Pub. No. 2006/0221692. The read and verify operations described above are performed according to techniques known in the art. Thus, many of the details explained can be varied by one skilled in the art. Other read and verify techniques known in the art can also be used.

Figure 9:
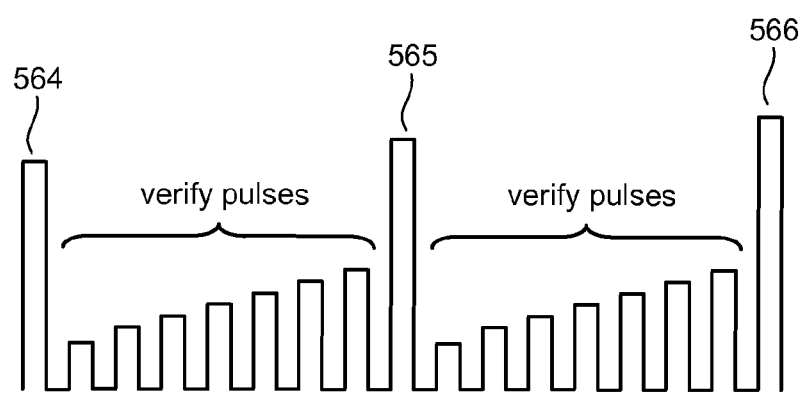
FIG. 9 depicts three programming pulses, and the verify pulses applied between the programming pulses.

In some embodiments, the program voltage applied to the control gate includes a series of pulses that are increased in magnitude with each successive pulse by a predetermined step size (e.g. 0.2 v, 0.3 v, 0.4 v, or others). Between pulses, some memory systems will verify whether the individual memory cells have reached their respective target threshold voltage ranges. For example, FIG. 9 shows a portion of a signal applied to the control gates of a plurality of memory cells connected to a common word line. FIG. 9 shows programming pulses 564, 565 and 566, with a set of verify pulses between the programming pulses. When performing full sequence programming in one embodiment, the verification process between programming pulses will test for each of the threshold voltage distribution (data states) S1-S7. Therefore, FIG. 9 shows seven verify pulses that have magnitudes corresponding to verify target levels Vv1, Vv2, Vv3, Vv4, Vv5, Vv6, and Vv7. In some embodiments, one or more of the verify operations can be skipped (and, therefore one or more of the verify pulses can be skipped) because the verify operation is not necessary or superfluous. For example, if none of the memory cells being programmed according to FIG. 8 have reached Vv2, there is no reason to verify at Vv7. More information about intelligent verification schemes that skip verification for one or more states can be found in the following patent documents which are incorporated herein by reference in their entirety: U.S. Pat. No. 7,073,103; U.S. Pat. No. 7,224,614; U.S. Pat. No. 7,310,255; U.S. Pat. No. 7,301,817; U.S. Patent App. 2004/0109362; and U.S. Patent App. 2009/0147573.

Figure 10A:
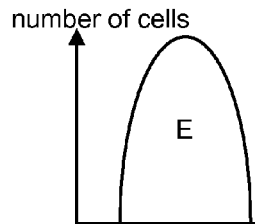
FIGS. 10A-E show various threshold voltage distributions and describe a process for programming non-volatile memory.
Figure 10B:
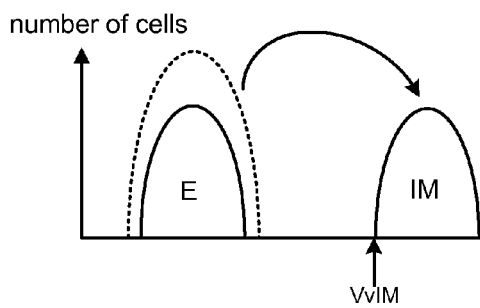

FIG. 8 shows a programming process that includes one phase where all memory cells connected to the same word line are programmed concurrently during that one phase. FIGS. 10A-E illustrates a multi-phase programming approach. In this embodiment, the programming process includes three phases. Prior to programming, the memory cells are erased so that all memory cells connected to a common word line are in an erased threshold voltage distribution E, as depicted in FIG. 10A. During the first phase of programming, those memory cells whose targets (due to the data to be stored in those memory cells) are data states S4, S5, S6 or S7 are programmed to an intermediate state IM. Those memory cells are targeted for data states S0, S1, S2 or S3 and remain in the erased threshold voltage distribution E. The first phase is graphically depicted by FIG. 10B. Memory cells being programmed to intermediate state IM are programmed to a target threshold voltage of VvIM.

Figure 10C:
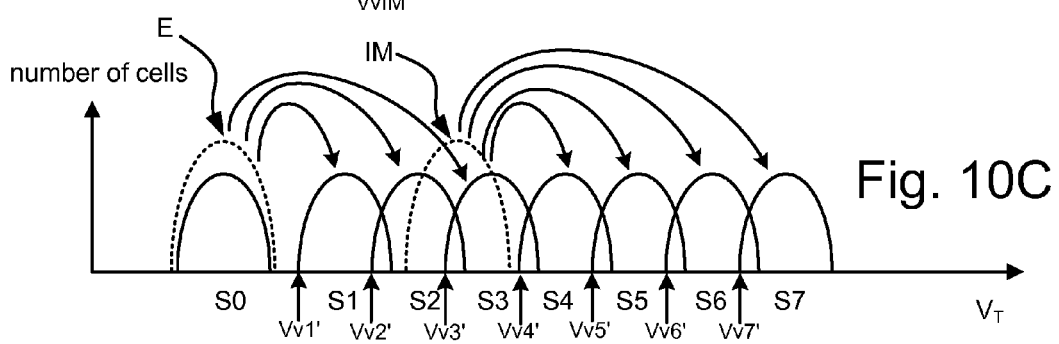
Figure 10D:
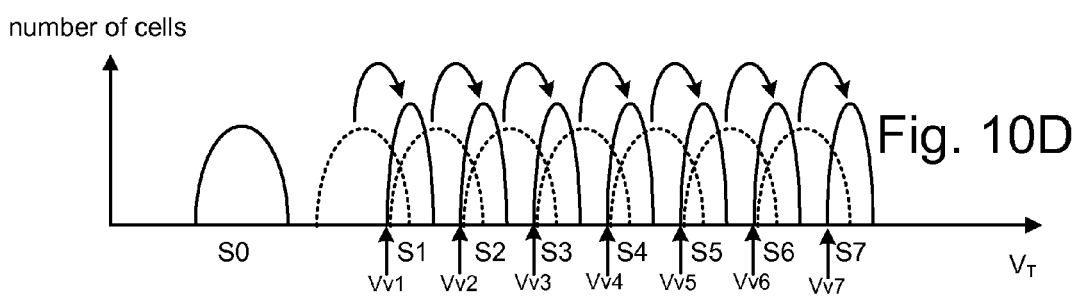
Figure 10E:
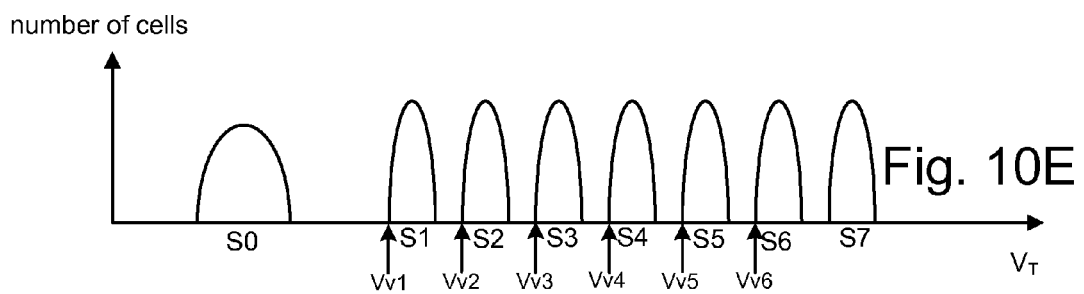

During the second phase of the programming process of FIGS. 10A-E, those memory cells that are in the erased threshold voltage distribution E are programmed to their target data states. For example, those memory cells to be programmed to data state S3 are programmed from erased threshold voltage distribution E to data state S3, those memory cells to be programmed to data state S2 are programmed from erased threshold voltage distribution E to data state S2, those memory cells to be programmed to data state S1 are programmed from erase threshold voltage distribution E to data state S1, and those memory cells to be in data state S0 are not programmed during the second phase of the programming process. Thus, erased threshold voltage distribution E becomes data state S0. Also, during the second phase, memory cells are programmed from the intermediate state IM to various data states S4-S7. For example, those memory cells to be programmed to data state S7 are programmed from the intermediate state IM to data state S7, those memory cells targeted to be in data state S6 are programmed from intermediate state IM to data state S6, both memory cells to be programmed to data state S5 are programmed from intermediate state IM to data state S5, and those memory cells to be programmed to data state S4 are programmed from intermediate state IM to data state S4. This second phase of programming is illustrated in FIG. 10C.

As can be seen in FIG. 10C, at the end of the second phase of programming data states S1-S7 overlap with neighboring data states. For example, data state S1 overlaps with data state S2, data state S2 overlaps with data states S1 and S3, data state S3 overlaps with data states S2 and S4, data state S4 overlaps with data states S3 and S5, data state S5 overlaps with data states S4 and S6, and data state S6 overlaps with data states S5 and S7. In some embodiments, all or some of the data states do not overlap.

In the third phase of programming, each of data states S1-S7 are tightened so that they no longer overlap with neighboring states. This is depicted graphically by FIG. 10D. The final result of the three phrase programming process is depicted in step 10E, which shows data states S0-S7. In some embodiments, data state S0 is wider than data states S1-S7.

In some embodiments, those memory cells to be programmed to data state S4 are not programmed during the second phase and, therefore, remain in intermediate state IM. During the third programming phase, the memory cells are programmed from IM to S4. In other embodiments, memory cells destined for other states can also remain in IM or E during the second phase.

Figure 11:
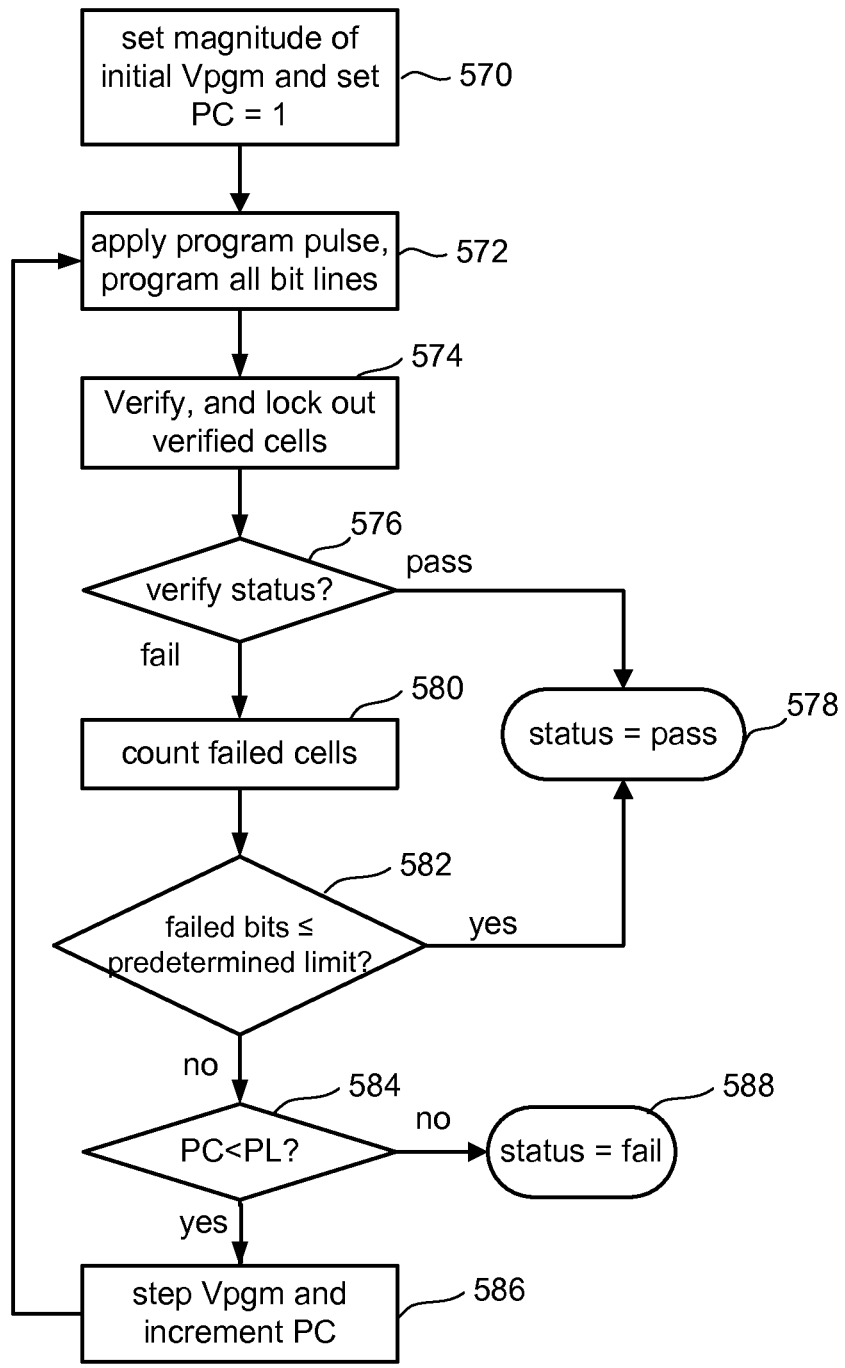
FIG. 11 is a flow chart describing one embodiment of a process for programming non-volatile memory.

FIG. 11 is a flow chart describing one embodiment of a process for performing programming on memory cells connected to a common word line to one or more targets (e.g., data states or threshold voltage ranges). The process of FIG. 11 can be performed one or multiple times during step 556 of FIG. 7. For example, the process of FIG. 11 can be used to program memory cells (e.g., full sequence programming) from state S0 directly to any of states S1-S7. Alternatively, the process of FIG. 11 can be used to perform one or each of the phases of the process of FIG. 10A-E. For example, when performing the process of FIG. 10A, the process of FIG. 11 is used to implement the first phase that includes programming some of the memory cells from state E to state IM. The process of FIG. 11 can then be used again to implement the second phase that includes programming some of the memory cells from state E to states S1-S3 and from state IM to states S4-S7. The process of FIG. 11 can be used again to adjust states S1-S7 in the third phase (see FIG. 10D). The process of FIG. 11 can also be used with other multi-phase programming processes.

Typically, the program voltage applied to the control gate during a program operation is applied as a series of program pulses. Between programming pulses are a set of verify pulses to perform verification. In many implementations, the magnitude of the program pulses is increased with each successive pulse by a predetermined step size. In step 570 of FIG. 11, the programming voltage (Vpgm) is initialized to the starting magnitude (e.g., ~12-16V or another suitable level) and a program counter PC maintained by state machine 222 is initialized at 1. In step 572, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming. In step 572, the program pulse is concurrently applied to all memory cells connected to the selected word line so that all of the memory cells connected to the selected word line are programmed concurrently. That is, they are programmed at the same time (or during overlapping times). In this manner all of the memory cells connected to the selected word line will concurrently have their threshold voltage change, unless they have been locked out from programming.

In step 574, the appropriate memory cells are verified using the appropriate set of target levels to perform one or more verify operations. In one embodiment, the verification process is performed by applying the testing whether the threshold voltages of the memory cells selected for programming have reached the appropriate verify compare voltage (Vv1, Vv2, Vv3, Vv4, Vv5, Vv6, and Vv7).

In step 576, it is determined whether all the memory cells have reached their target threshold voltages (pass). If so, the programming process is complete and successful because all selected memory cells were programmed and verified to their target states. A status of "PASS" is reported in step 578. If, in 576, it is determined that not all of the memory cells have reached their target threshold voltages (fail), then the programming process continues to step 580.

In step 580, the system counts the number of memory cells that have not yet reached their respective target threshold voltage distribution. That is, the system counts the number of cells that have failed the verify process. This counting can be done by the state machine, the controller, or other logic. In one implementation, each of the sense block 300 (see FIG. 3) will store the status (pass/fail) of their respective cells. These values can be counted using a digital counter. As described above, many of the sense blocks have an output signal that is wire-Or'd together. Thus, checking one line can indicate that no cells of a large group of cells have failed verify. By appropriately organizing the lines being wired-Or together (e.g., a binary tree-like structure), a binary search method can be used to determine the number of cells that have failed. In such a manner, if a small number of cells failed, the counting is completed rapidly. If a large number of cells failed, the counting takes a longer time. More information can be found in United States Patent Publication 2008/0126676, incorporated herein by reference in its entirety. In another alternative, each of the sense amplifiers can output an analog voltage or current if its corresponding memory cell has failed and an analog voltage or current summing circuit can be used to count the number of memory cells that have failed.

In one embodiment, there is one total count, which reflects the total number of memory cells currently being programmed that have failed the last verify step. In another embodiment, separate counts are kept for each data state.

In step 582, it is determined whether the count from step 580 is less than or equal to a predetermined limit. In one embodiment, the predetermined limit is the number of bits that can be corrected by ECC during a read process for the page of memory cells. If the number of failed cells is less than or equal to the predetermined limit, than the programming process can stop and a status of "PASS" is reported in step 578. In this situation, enough memory cells programmed correctly such that the few remaining memory cells that have not been completely programmed can be corrected using ECC during the read process. In some embodiments, step 580 will count the number of failed cells for each sector, each target data state or other unit, and those counts will individually or collectively be compared to a threshold in step 582.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed, temperature or other criteria.

If number of failed memory cells is not less than the predetermined limit, than the programming process continues at step 584 and the program counter PC is checked against the program limit value (PL). Examples of program limit values include 20 and 30; however, other values can be used. If the program counter PC is not less than the program limit value PL, then the program process is considered to have failed and a status of FAIL is reported in step 588. If the program counter PC is less than the program limit value PL, then the process continues at step 586 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 586, the process loops back to step 572 and another program pulse is applied to the selected word line.

Figure 12:
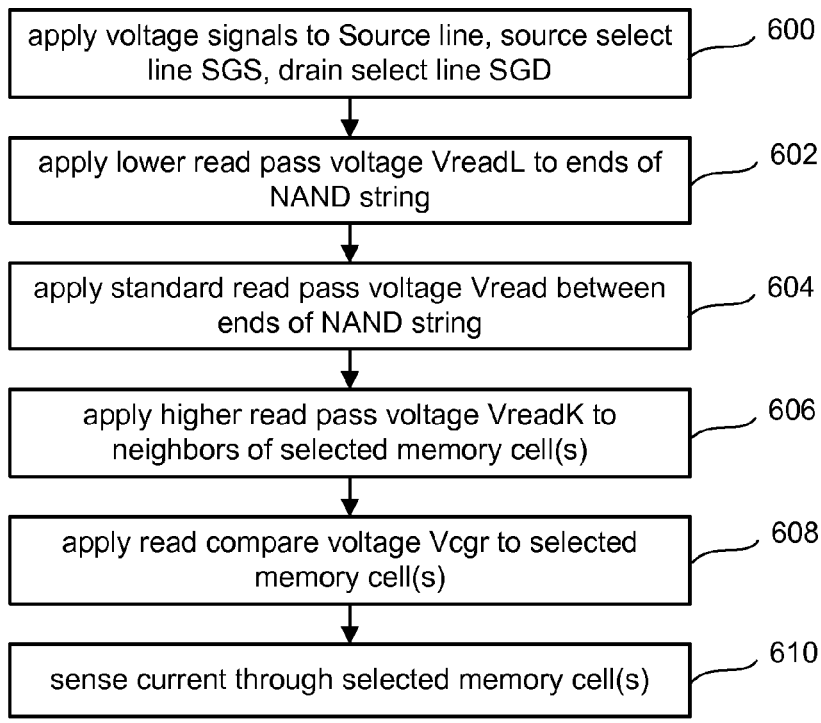
FIG. 12 is a flow chart describing one embodiment of a process for reading from non-volatile storage.

FIG. 12 is a flow chart describing one embodiment of a process for reading data. The depicted method reduces the effects of read disturb (described above).

In many memory systems, the end word lines (e.g. word lines at or close to the select gates of a NAND string) are wider than the middle word lines (word lines that are between the end word lines) in a memory array due to process limitations. In other embodiments, other critical dimensions can also vary for the end word lines as compared to the middle word lines. As memory cells scale down to smaller sizes, the difference in width between the end and middle word lines will become even more of a disparity. In NAND flash memory, the wider word lines at the end will provide a stronger coupling between the control gate and floating gate, which results in faster programming and a higher chance of Read Disturb occurring. Although error correction (ECC) can be used to fix errors in the data, if there are too many errors, even ECC will not work.

Previous systems have used dynamic read compare levels to reduce failures. For example, Vr1, Vr2, Vr3, . . . are periodically recomputed. However, this may not be sufficient if the Read Disturb is severe enough on the end word lines.

A memory system could also lower the pass voltage (e.g. Vread—see below) applied to unselected word lines to reduce the overall Read Disturb. However, this would cause a higher NAND string resistance to the downscaling of the pass voltage, thereby reducing the accuracy of the read process.

To reduce the effects of Read Disturb due to the end word lines being wider, the process of FIG. 12 proposes to use a lower pass voltage at the end of the NAND strings as compared to the middle of the NAND strings. Step 600 of FIG. 12 includes applying voltage signals to the source line, source select line SGS and drain select line SGD (see FIGS. 2 and 5). In step 602, a lower read pass voltage, VreadL, is applied to memory cells at the ends of the NAND string. In step 604, the standard read pass voltage, Vread, is applied to the middle memory cells, which are those memory cells between the ends of the NAND string that are not selected for reading. In step 606, a higher read pass voltage, VreadK, is applied to those memory cells of the NAND string that are neighbors to the selected memory cell. In step 608, the read compare voltage, Vcgr, is applied to the selected memory cell. In step 610, the system will sense the current through the selected memory cell in response to the voltages applied in steps 600-608.

In many embodiments, the system will read multiple memory cells at the same time. Therefore, the process of 600-610 will be performed concurrently on multiple NAND strings of the same block such that multiple memory cells will be read concurrently.

Figure 13:
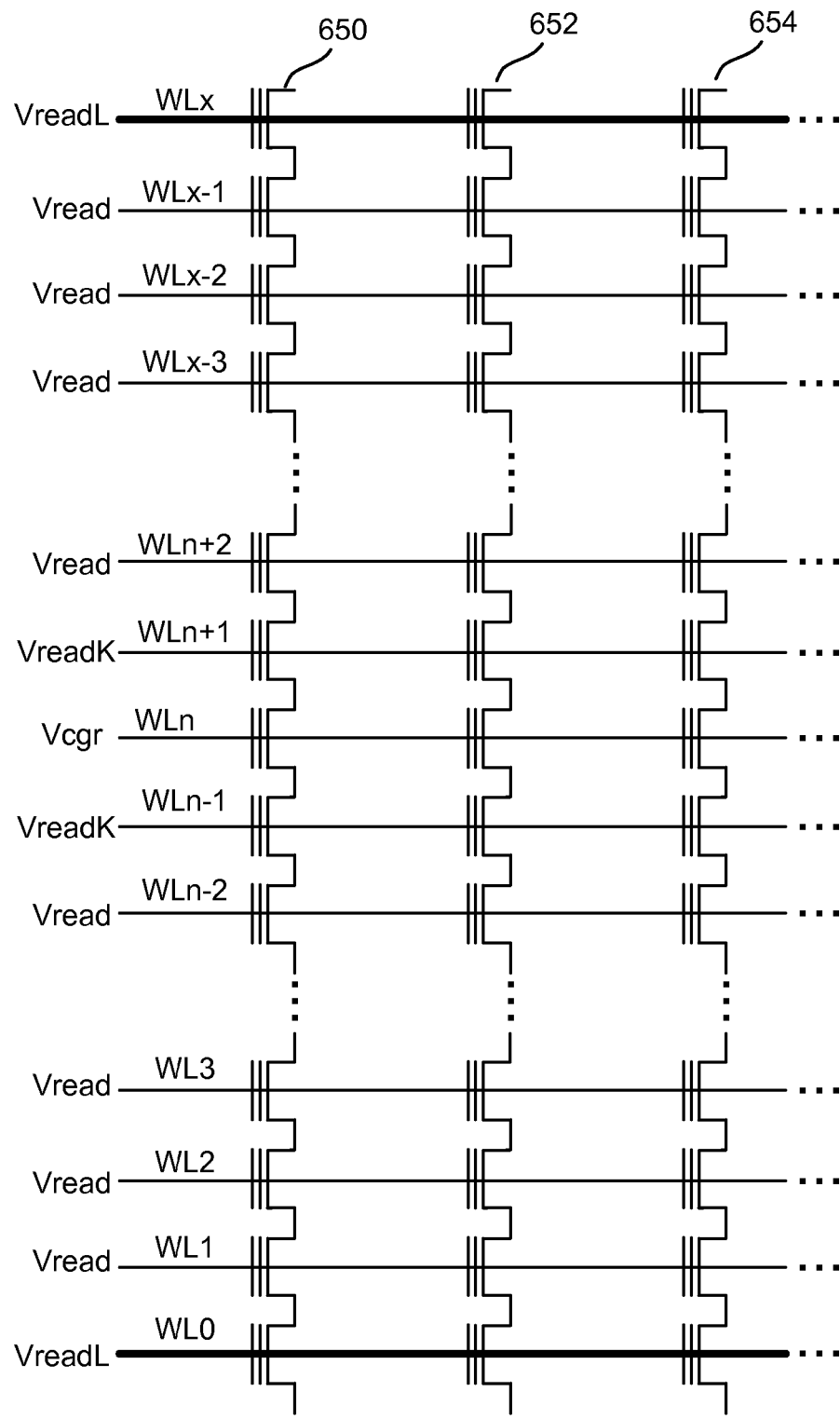
FIG. 13 is a schematic diagram showing three NAND strings and an associated set of word lines being biased for reading.

FIG. 13 shows three NAND strings 650, 652 and 654 of a block of memory cells implementing the process of FIG. 12. In the example embodiment of FIG. 13, a NAND string will include x+1 memory cells. Therefore, the block of NAND strings will include x+1 word lines (WL0-WLx). In the depicted example, word line WLn is selected for reading; therefore, all the memory cells connected to WLn will be read. As per step 608 of FIG. 12, FIG. 13 shows WLn receiving Vcgr, the read compare voltage. As per step 606 of FIG. 12, FIG. 13 shows neighboring word lines WLn−1 and WLn+1 receiving the higher read pass voltage, VreadK. As per step 604 FIG. 12, FIG. 13 shows the word lines (WL1, WL2 ... WLN−2, WLN+2, ... WLx−3, WLx−2, WLx−1) that are not connected to end memory cells receiving the standard read pass voltage, Vread. As per step 602 of FIG. 12, FIG. 13 shows the end word lines (in the example, the word lines at the extreme end of the NAND string), WL0 and WLx, receiving the lower read pass voltage VreadL. In this embodiment, the various voltages Vread, VreadL and VreadK are provided to the control gates of the respective memory cells by applying the voltages to the word lines, which are connected to the control gates of memory cells. As seen from FIG. 13, each word line is connected to the control gate of multiple memory cells so that the read and programming operations are performed in parallel.

Figure 14:
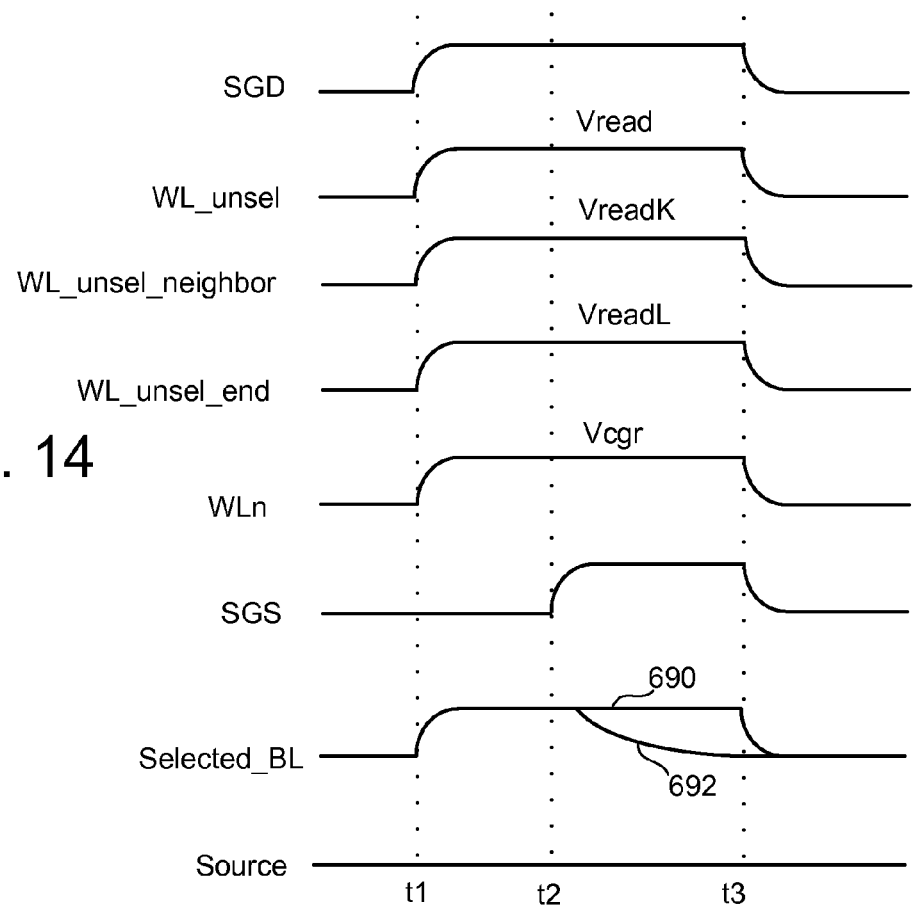
FIG. 14 is a timing diagram depicting a read process.

FIG. 14 is a timing diagram depicting the behavior of various signals during one iteration of a read or verify operation (e.g., the process of FIG. 12). For example, if the memory cells are binary memory cells, the process of FIG. 14 may be performed in parallel for each memory cell during a read or verify process. If the memory cells are multi-state memory cells, the process of FIG. 14 may be performed multiple times for each memory cell in parallel during a read or verify process. For example, when reading data from a memory cell with eight states, the read process may be performed once with Vcgr=Vr1, once with Vcgr=Vr2, once with Vcgr=Vr3, once with Vcgr=Vr4, once with Vcgr=Vr5, once with Vcgr=Vr6, and once with Vcgr=Vr7. Other sets of read values can also be used and some embodiments will perform less than all of the read operations based on a need to read only a subset of pages of data or other reasons.

FIG. 14 shows signals SGD, WL_unsel, WL_unsel_neighbor, WL_unsel_end, WLn, SGS, Selected BL, and Source starting at Vss (approximately 0 volts). SGD represents the signal on the drain select line connected to the gate of the drain select gate. SGS represents the signal on the source select line connected to the gate of the source select gate. WLn is the word line selected for reading/verification. WL_unsel_neighbor represents the unselected word lines that are adjacent to the selected word line. WL_unsel_end represents the unselected word lines that are connected to memory cells at the end of the NAND strings. WL_unsel represents the unselected word lines that are not WL_unsel_neighbor and WL_unsel_end. Selected_BL is the bit line selected for reading/verification. Source is the source line for the memory cells.

FIG. 14 describes the behavior of a system that measures the conduction current of a memory cell by determining whether the bit line has appropriately discharged. At time t1 of FIG. 14, SGD is raised to Vdd (e.g., approximately 3.5 volts) or another voltage, typically in the 3-5V range, the unselected word lines (WL_unsel) are raised to Vread (e.g., approximately 7.4 volts), the unselected word lines that are next to the selected word line (WL_unsel_neighbor) are raised to VreadK (e.g., ~Vread+0.6 volts)), the unselected word lines at the end of the NAND string (WL_unsel_end) are raised to VreadL (e.g., ~Vread−0.1 v), the selected word line WLn is raised to Vcgr, and the selected bit line Selected BL is precharged to approximately 0.7 volts. The voltages Vread, VreadK and VreadL act as pass voltages because they cause the unselected memory cells to turn on and act as pass gates. At time t2, the source select gate is turned on by raising SGS to Vdd. This provides a path to reduce the charge on the bit line. If the threshold voltage of the memory cell selected for reading is greater than Vcgr, then the selected memory cell will not turn on (or at least will not turn on sufficiently) and the bit line will not discharge (or at least will not discharge sufficiently), as depicted by signal line 690. If the threshold voltage in the memory cell selected for reading is below Vcgr, then the memory cell selected for reading will turn on (conduct) and the bit line voltage will decrease, as depicted by curve 692. At some point after time t2 and prior to time t3 (as determined by the particular implementation), the appropriate sense amplifier will determine whether the bit line voltage has decreased by a sufficient amount. At time t3, the depicted signals will be lowered to Vss (or another value for standby or recovery). Note that in other embodiments, the timing of some of the signals can be changed.

Figure 15:
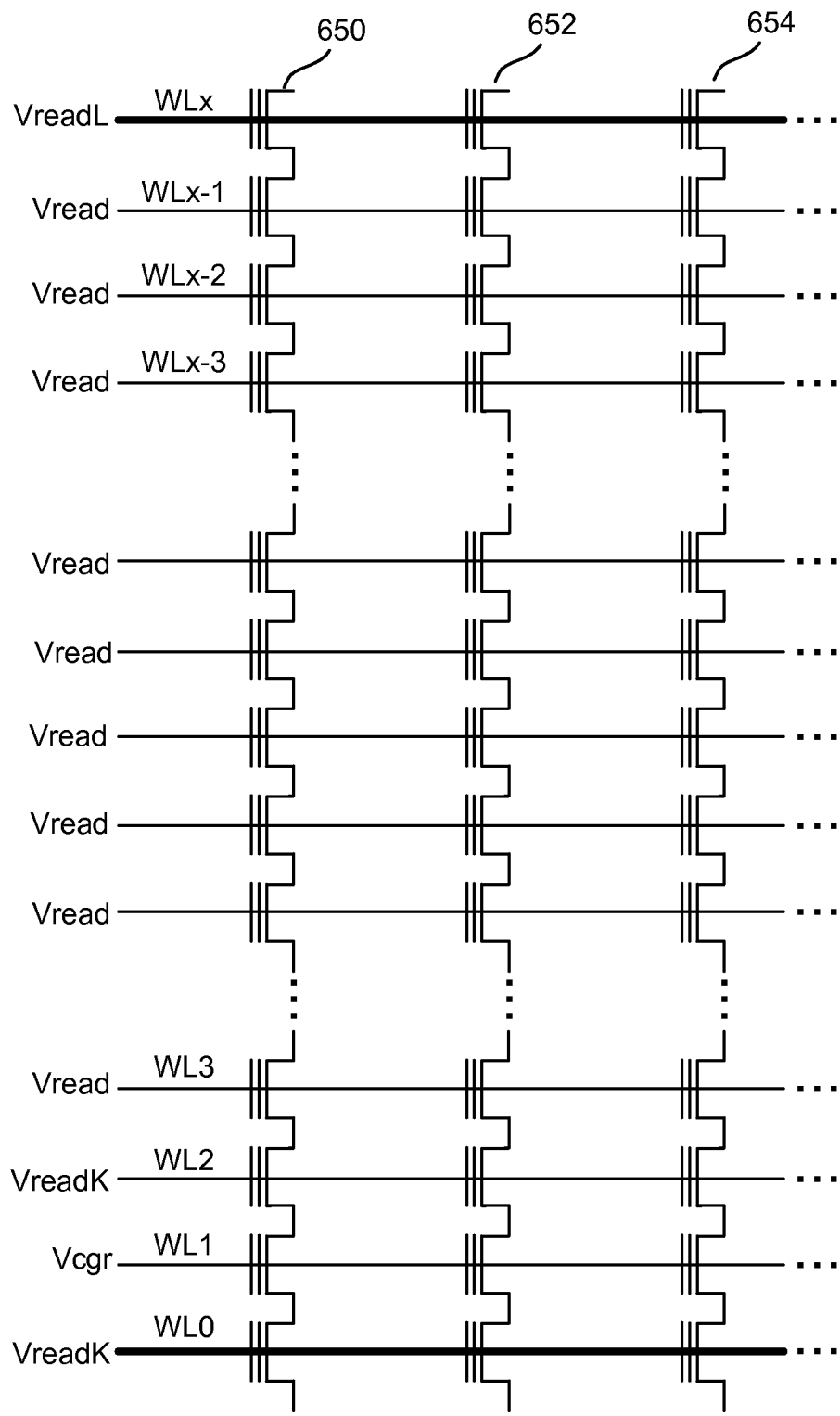
FIGS. 15-22 are schematic diagrams showing three NAND strings and an associated set of word lines being biased for reading.

FIG. 15 is a schematic of the same three NAND strings 650, 652 and 654 implementing the same embodiment as FIG. 14; however, in the situation depicted in FIG. 15, WL1 is selected for programming. Since it is selected for programming, word line WL1 receives the read compare voltage Vcgr. In the situation of FIG. 15, the end word line WL0 is the neighbor word line to the selected word line so word line WL0 will receive the higher read pass voltage VreadK. The other neighbor word line, WL2, will also receive the higher read pass voltage VreadK. Word lines WL3-WLx−1 will received Vread. The other end word line, WLx, will receive VreadL.

If WL0 is selected for programming, then WL0 will receive Vcgr, WL1 will receive VreadK, WL2-WLx−1 will receive Vread, and WLx will receive VreadL. Similarly, if WLx is selected for reading, then WLx will receive Vcgr, WLx−1 will receive VreadK, WLx−2-WL1 will receive Vread, and WL0 will receive VreadL.

Figure 16:
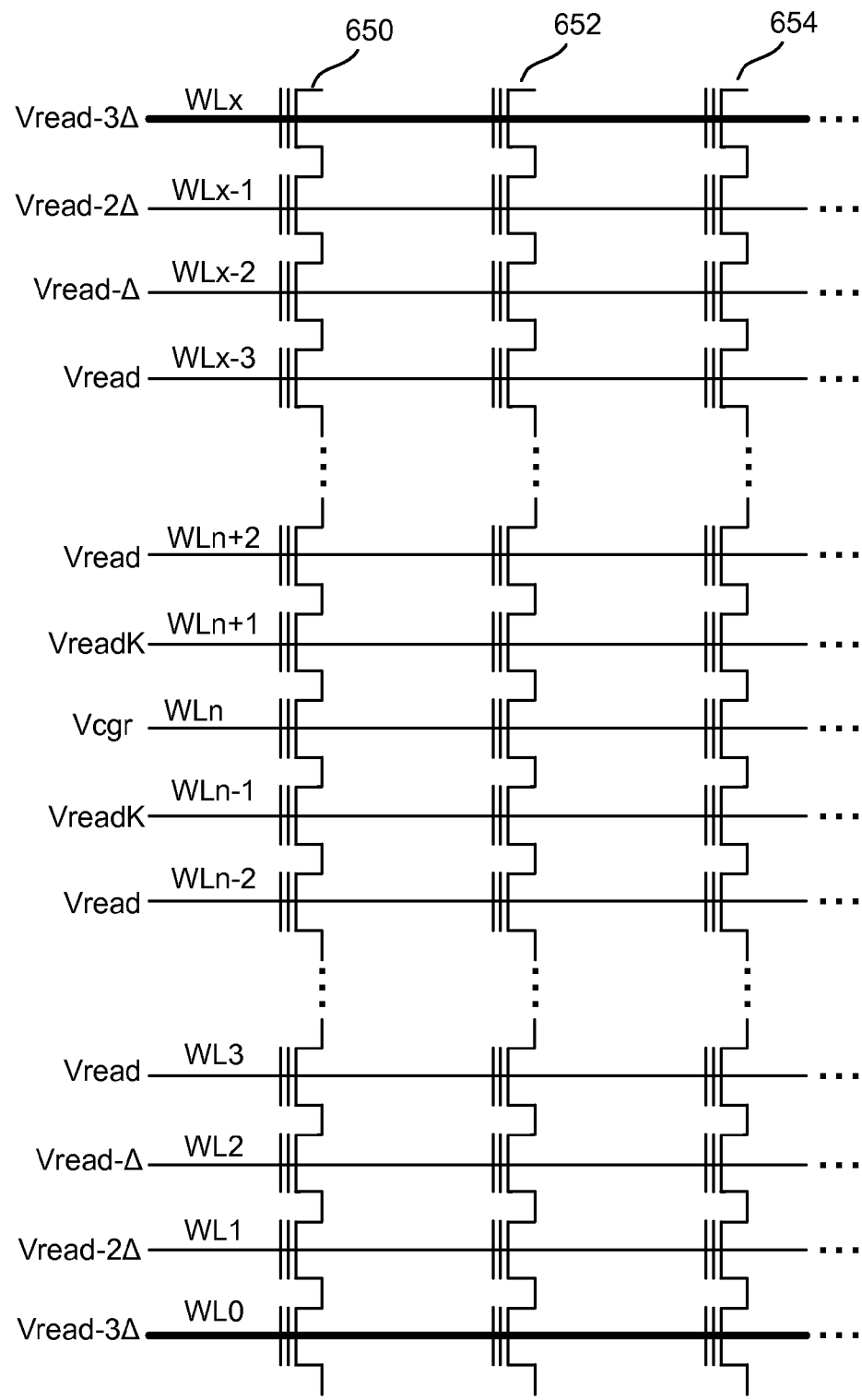

FIGS. 16-22 and 24-28 depict other embodiments for implementing the read process. For example, in the embodiment of FIGS. 16-19, the end memory cells for a NAND string include a set of three memory cells at each side of the NAND string (as compared to the embodiment of FIG. 13 where the end memory cells include only one memory cell each end). In one embodiment, all the memory cells that are end memory cells will receive VreadL. In another embodiment, as depicted in FIG. 16, the memory cells at the end of NAND string will receive a set of lower read pass voltages applied as a gradient. For example, FIG. 16 shows word line WL0 (the extreme end of the NAND string) receiving Vread-3Δ, WL1 receiving Vread-2Δ and WL2 receiving Vread-Δ. Similarly, WLx receives Vread-3Δ, WLx−1 receives Vread-2Δ and WLx−2 receives Vread-Δ. There are many suitable values can be used for Δ. In one embodiment, Δ is equal to 0.1 volts and Vread is equal to 7.4; therefore, WL0 receives 7.1 volts [7.4−3(0.1)], WL1 receives 7.2 volts [7.4−2(0.1)], WL2 receives 7.3[7.4−(0.1)], and WL3 receives 7.4 volts. in other embodiments, Δ can be equal to other values (e.g., 0.2, 0.3, 0.4, etc.).

Figure 17:
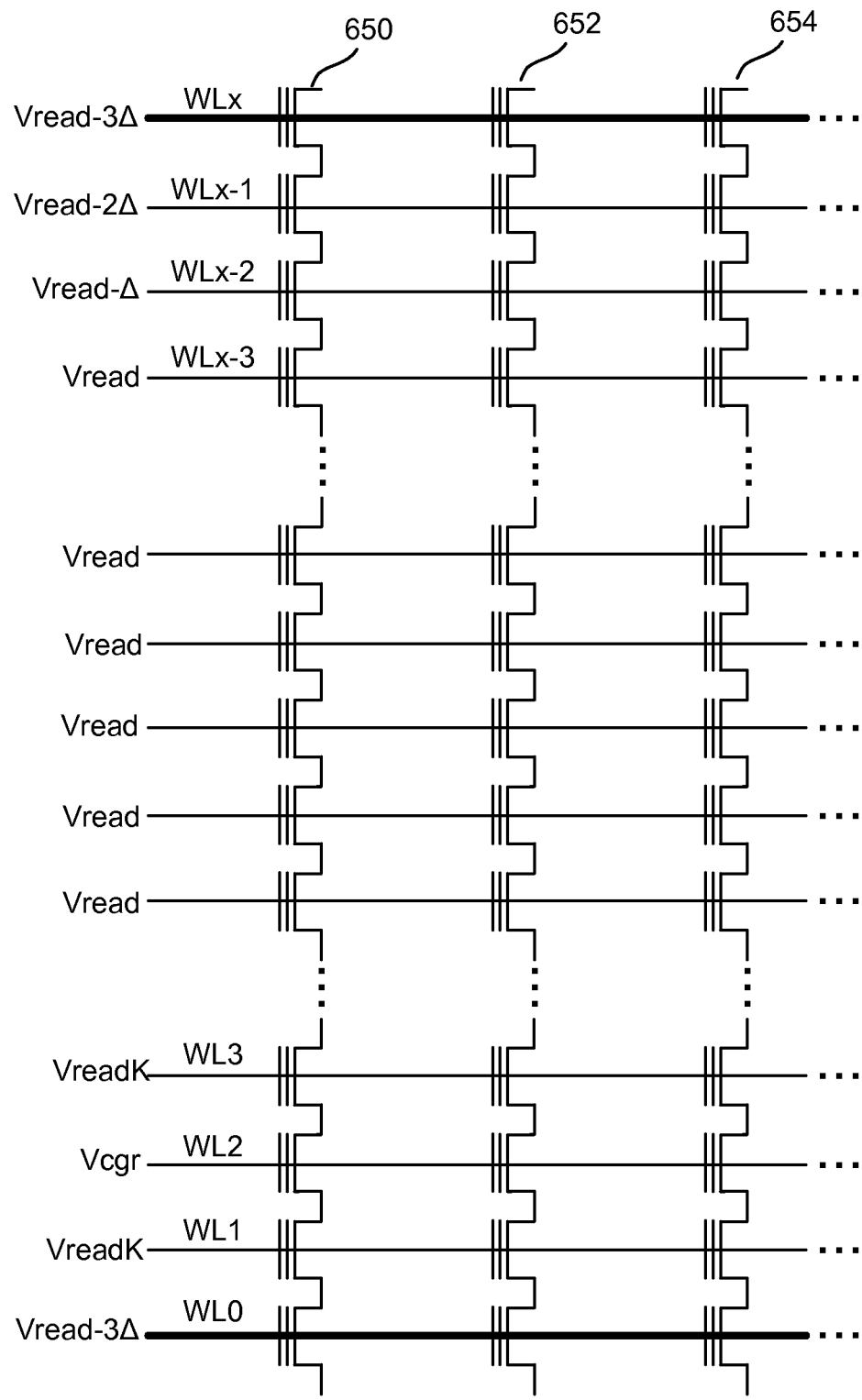

FIG. 17 shows the same embodiment as FIG. 16, in the situation where WL2 is the selected word line and memory cells connected to W12 will be read. In this example, WL2 will receive Vcgr and its two neighbors (WL1 and WL3) will receive VreadK. WL0 and WLx will receive Vread-3Δ. WLx−1 will receive Vread-2Δ and WLx−2 will receive Vread-Δ. WL4 (note depicted) through WLx−3 receive Vread.

Figure 18:
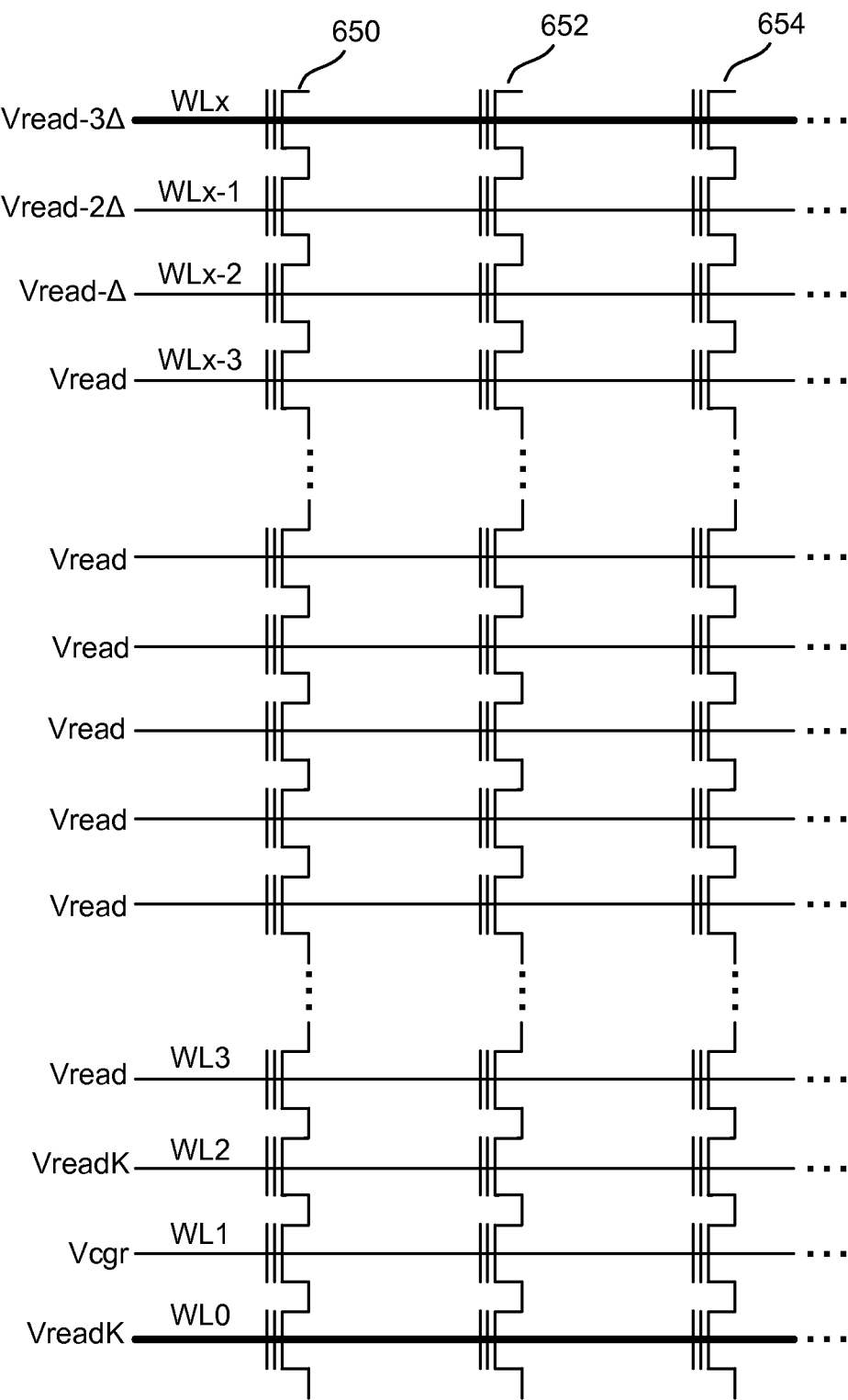

FIG. 18 depicts the same embodiment as FIGS. 16 and 17, but in the situation where WL1 is selected for reading. Therefore, WL1 will receive Vcgr and its two neighbors (WL0 and WL2) will receive VreadK. WLx will receive Vread-3Δ, WLx−1 will receive Vread-2Δ, and WLx−2 will receive Vread-Δ. WL3 through WLx−3 receive Vread.

Figure 19:
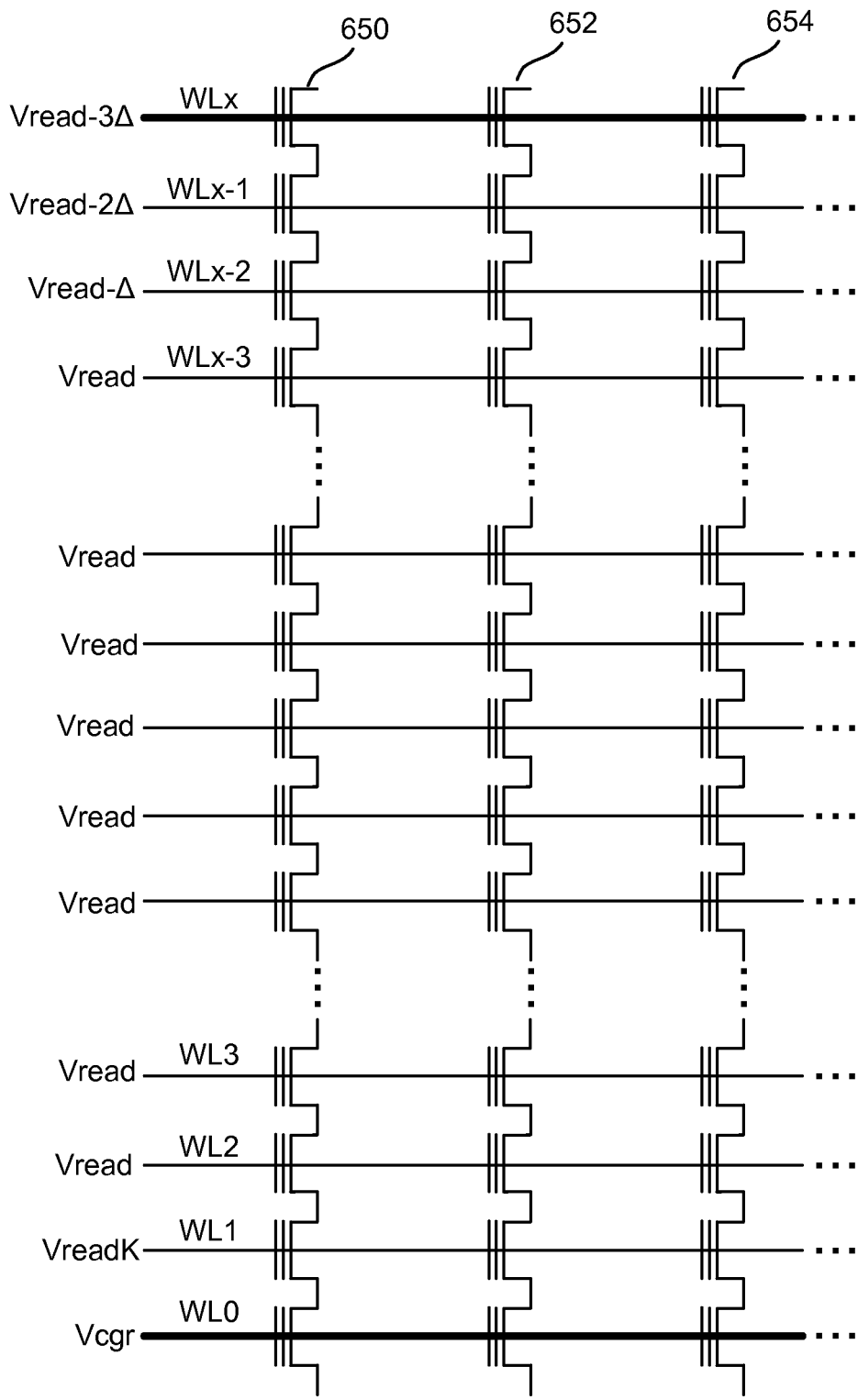

FIG. 19 shows the same embodiments as FIG. 16-18, but in a situation where WL0 is selected for reading. Therefore, WL0 will receive Vcgr and its one neighbor (WL1) will receive VreadK. WLx will receive Vread-3Δ, WLx−1 will receive Vread-2Δ and WLx−2 will receive Vread-Δ. The other word lines (WL2-WLx−3) will receive Vread.

Figure 20:
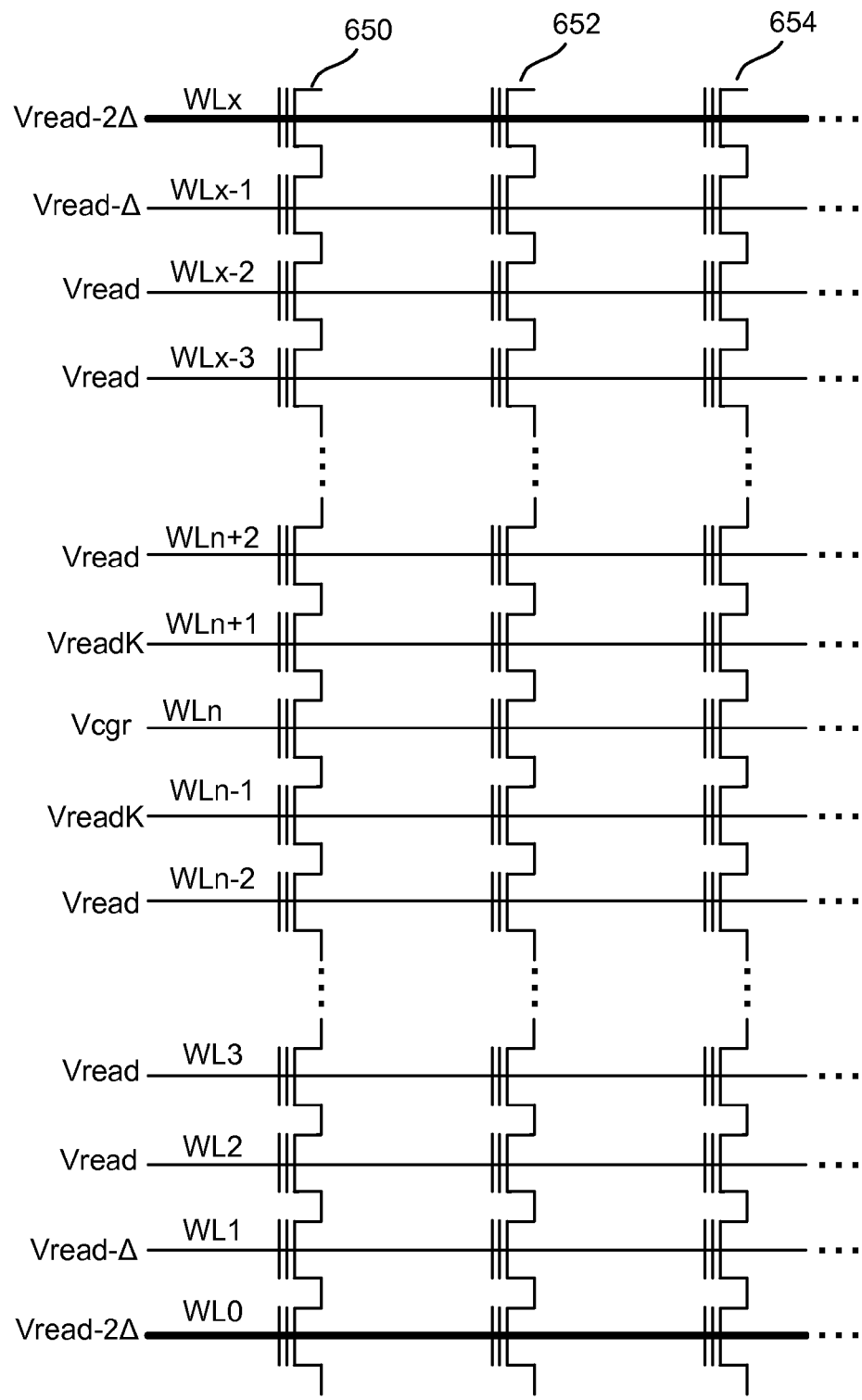

FIG. 20 shows another embodiment in which the set of end memory cells includes two memory cells at each end of the NAND string. In this embodiment, word lines at the extreme ends WL0 and WLx will receive Vread-2Δ as their read pass voltage. WL1 and WLx−1 will receive Vread-Δ. In this embodiment, the set of lower read pass voltages includes Vread-2Δ and Vread-Δ. Other than the selected memory cell and its neighbors, the remaining word lines will receive the standard read pass voltage Vread. The selected word line, WLn will receive Vcgr. The neighboring word line to the selected word line, WLn+1 and WLn−1, will receive VreadK.

Figure 21:
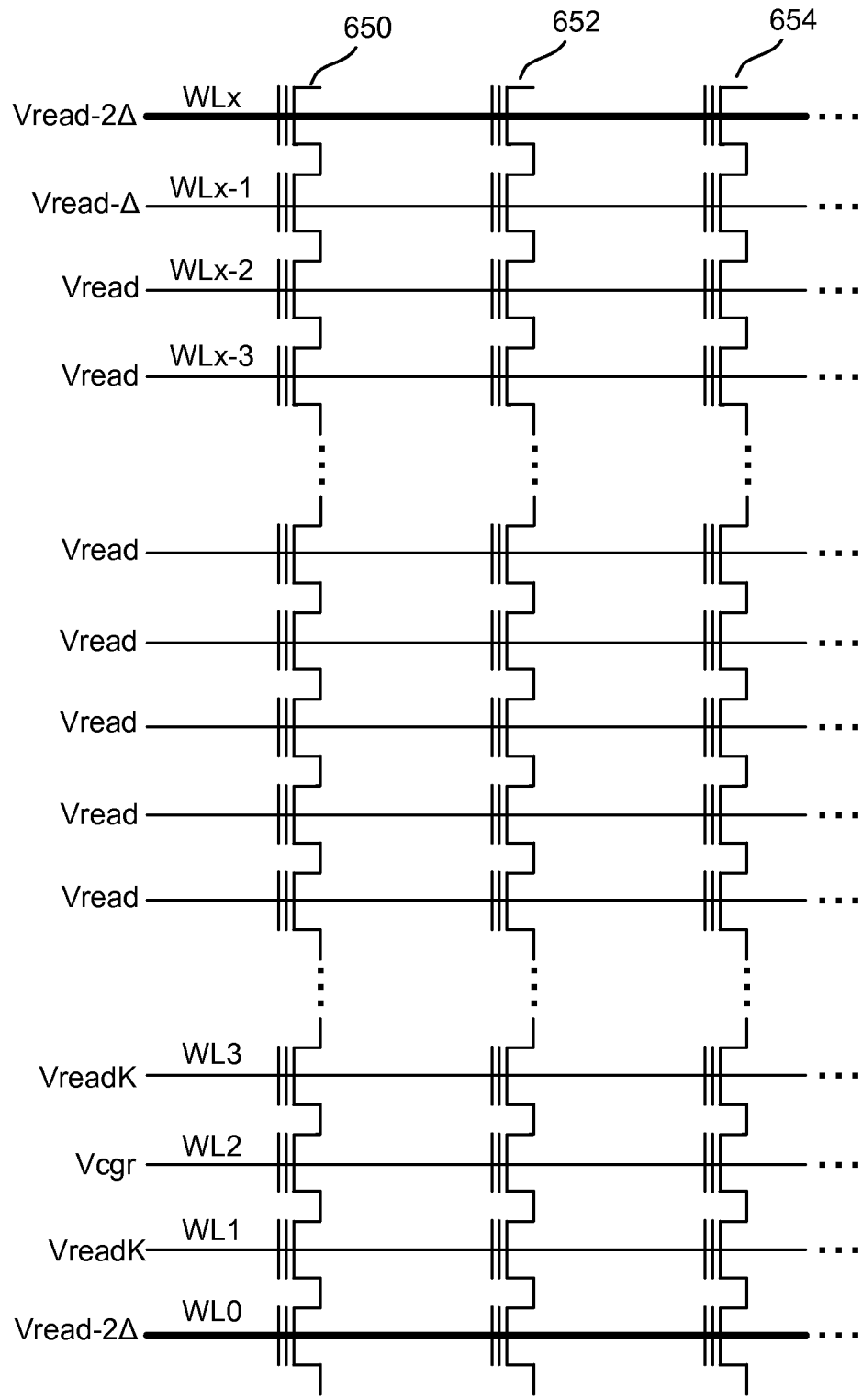

FIG. 21 depicts the same embodiment as FIG. 20, but in a situation where WL2 is selected for reading. In this case, WL1 and WL3 are neighbors to WL2 so they will receive VreadK. WL0 will receive Vread-2Δ because it is in the set of end word lines. The end word line WLx will receive Vread-2Δ and WLx−1 will receive Vread-Δ.

Figure 22:
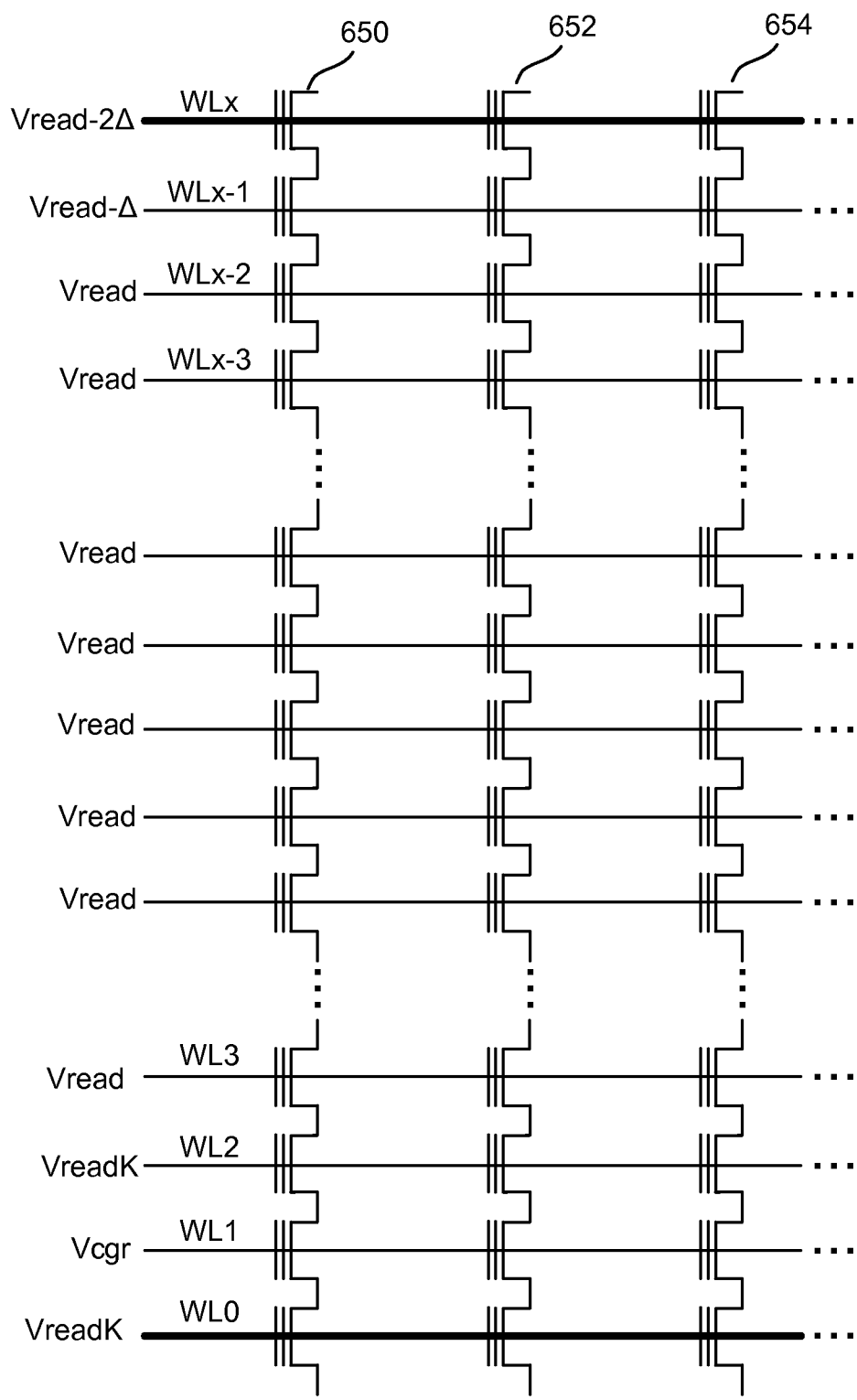

FIG. 22 shows the same embodiment as FIGS. 20 and 21, but in the situation where WL1 is selected for programming. Therefore, WL1 will receive Vcgr and its two neighbors (WL0 and WL2) will receive VreadK. Even though WL0 is in the set of end word lines, since it is a neighboring word line it will receive VreadK rather than a lower read pass voltage. The other side of the NAND string will remain unchanged from the earlier examples. Therefore, WLx will receive Vread-2Δ and WL−1 will receive Vread-Δ. The remaining word lines will receive Vread. Note that in FIGS. 15-22, word lines WL0 and WLx are drawn thicker than the other word lines in order to represent that they are wider than the other word lines.

Figure 23:
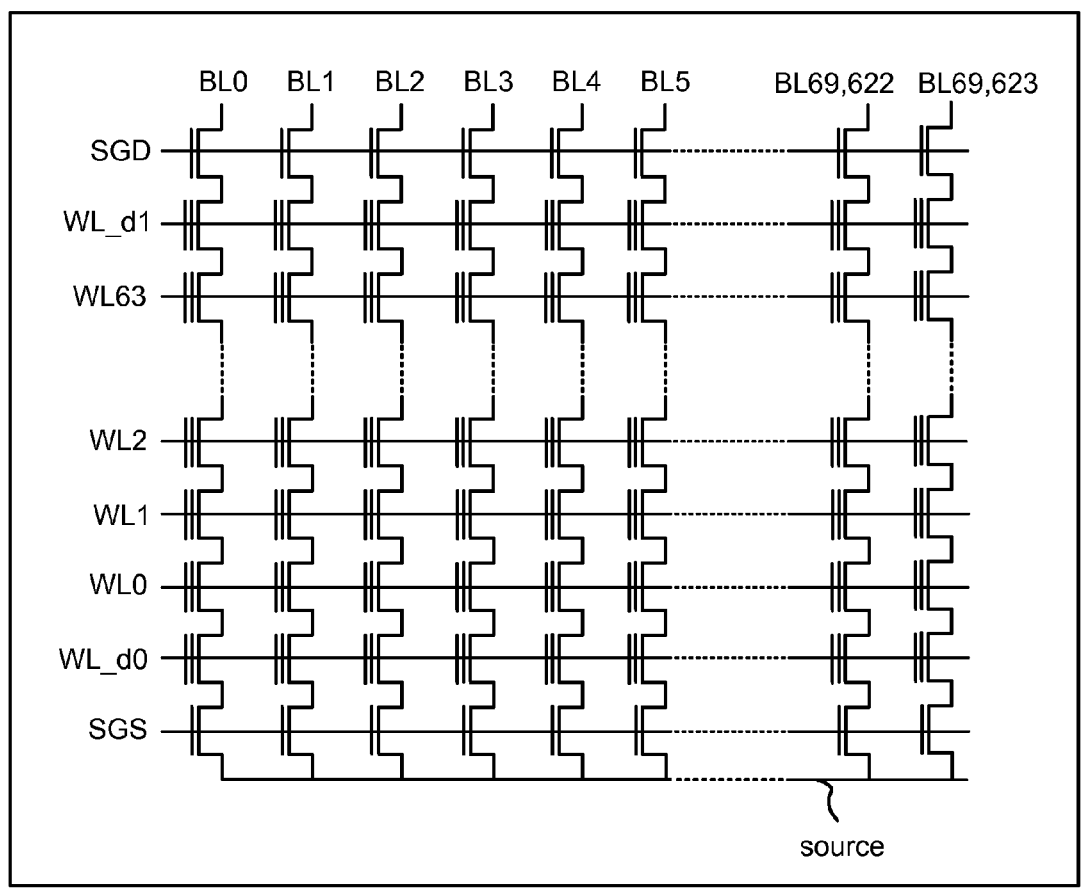
FIG. 23 shows one embodiment of a block of memory cells.
Figure 24:
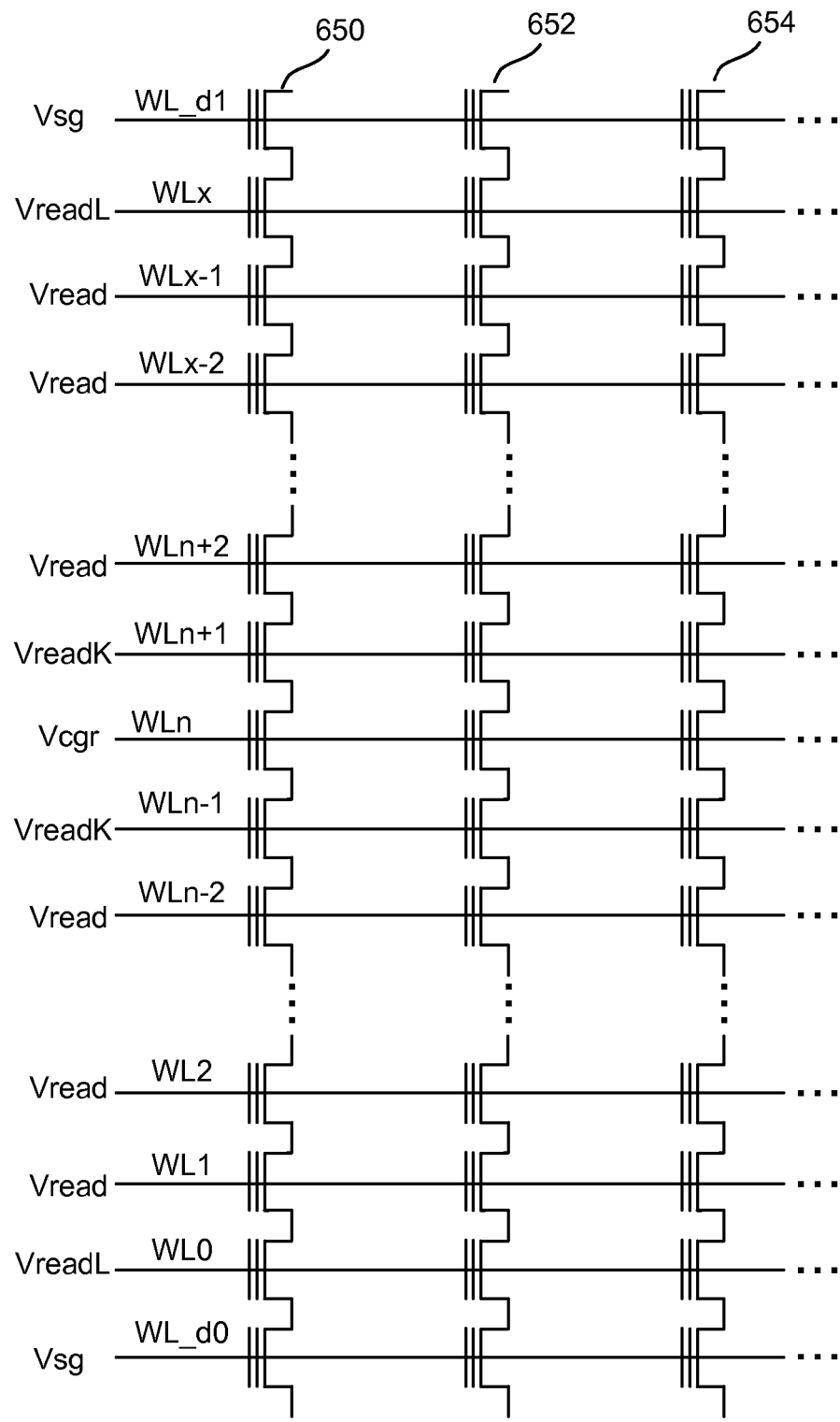
FIGS. 24-28 are schematic diagrams showing three NAND strings and an associated set of word lines being biased for reading.

FIG. 23 shows another embodiment of a block of memory cells. This block includes dummy memory cells and dummy word lines. In one embodiment, as depicted in FIG. 23, there are one or more dummy word lines at one end of a NAND string and one or more dummy word lines at another end of a NAND string. For example, WLd0 and WLd1 of FIG. 23 are both dummy word lines connected to dummy memory cells. These dummy memory cells do not store user data. The remaining memory cells on a NAND string (other than the dummy memory cells) can be referred to as data memory cells because they store user data or system data. The embodiments described above with respect to FIGS. 12-22 can be used with memory systems that include dummy memory cells (as depicted in FIG. 23 or another arrangement). In one example set of embodiments, the dummy word lines (e.g. WLd0 and WLd1) will receive a voltage Vsg (4.6 volts-5.6 volts) during the read process. Therefore, the process of FIG. 12 would include an additional step of applying Vsg to the dummy word lines. For example, FIG. 24 shows the embodiment of FIGS. 12-14 with the inclusion of dummy word lines receiving Vsg. The embodiments of FIGS. 15-22 can also include dummy word lines receiving Vsg.

In another set of embodiments, it is proposed to apply VreadK to the dummy word lines when performing a read process to read data from memory cells connected to an end word line and using Vsg on the dummy word lines when reading from memory cells connect to word lines in the middle of a NAND string. When performing a read process (read or verify) on memory cells connected to the end word lines (WL0 or WLx), using a higher voltage on the dummy word line (such as VreadK) will shift down the erase state (e.g. S0 of FIG. 8) for memory cells connected to the edge word lines to gain more margin to combat Read Disturb for memory cells connected to the end word lines WL0 and WLx. To further enhance this effect, it may be preferred to use a higher voltage than VreadK on the dummy word lines. For example, the dummy word lines could receive VreadK+Δ(the word Δ+0.1 volts or another value suitable to a particular implementation).

Figure 25:
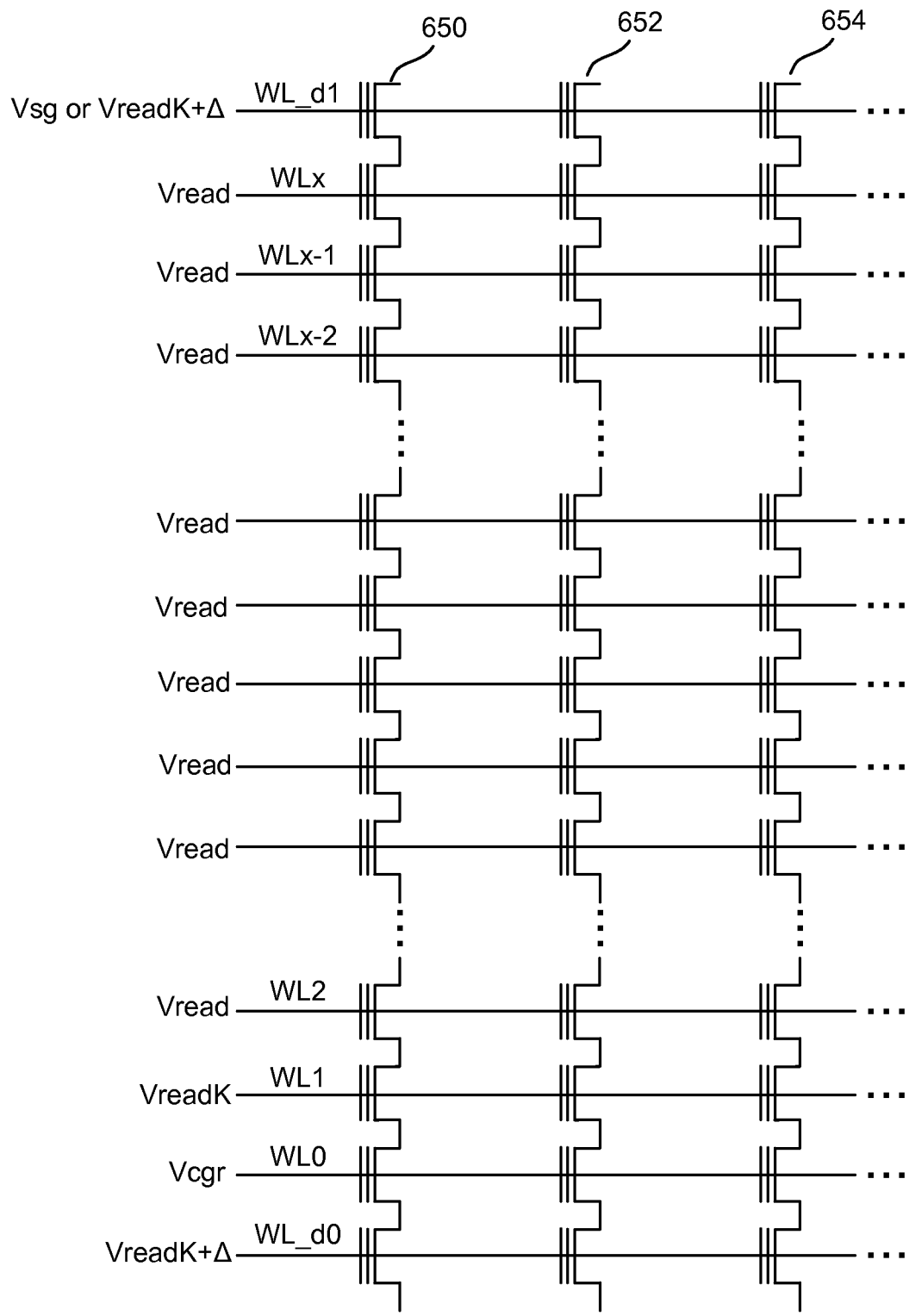

FIG. 25 shows one example of an embodiment which applies a higher voltage to the dummy word lines when reading an end word line. For example, FIG. 25 shows end word line WL0 selected for reading. Therefore, WL0 will receive Vcgr and its neighbor, WL1, will receive VreadK. The remaining word lines (other than dummy word lines) will receive Vread (the standard read pass voltage). In this embodiment, the dummy word line next to WL0 (WL_d0) will receive the higher voltage VreadK+Δ. The dummy word line on the other side of the NAND string, WL_d1, can receive Vsg or VreadK+Δ. It may be preferable to use Vsg as it is a lower voltage and will generally require less power. If WLx is selected for reading, then WL_d1 would receive VreadK+Δ, WLx would receive Vcgr, WLx−1 will receive VreadK, WL_d0 will receive Vsg or VreadK+Δ, and the remaining word lines would receive Vread.

Figure 26:
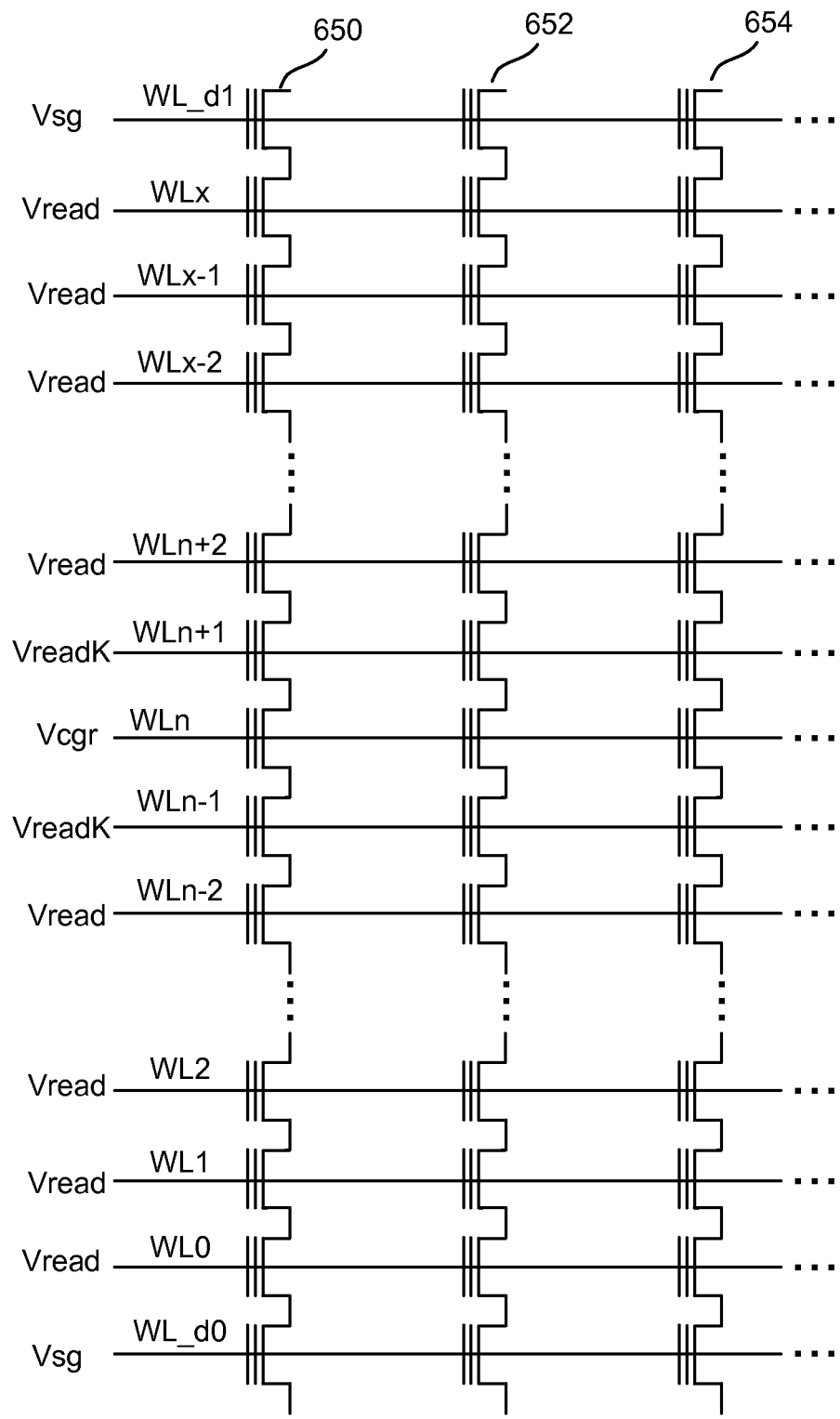

If a middle word line is selected for reading, then the dummy word lines (WLd0 and WLd1) will receive Vsg, as depicted by FIG. 26. In the situation depicted in FIG. 26, WLn is selected for reading. Therefore, WLn receives Vcgr, WLn+1 receives VreadK, WLn−1 receives VreadK and the remaining word lines will receive Vread.

Figure 27:
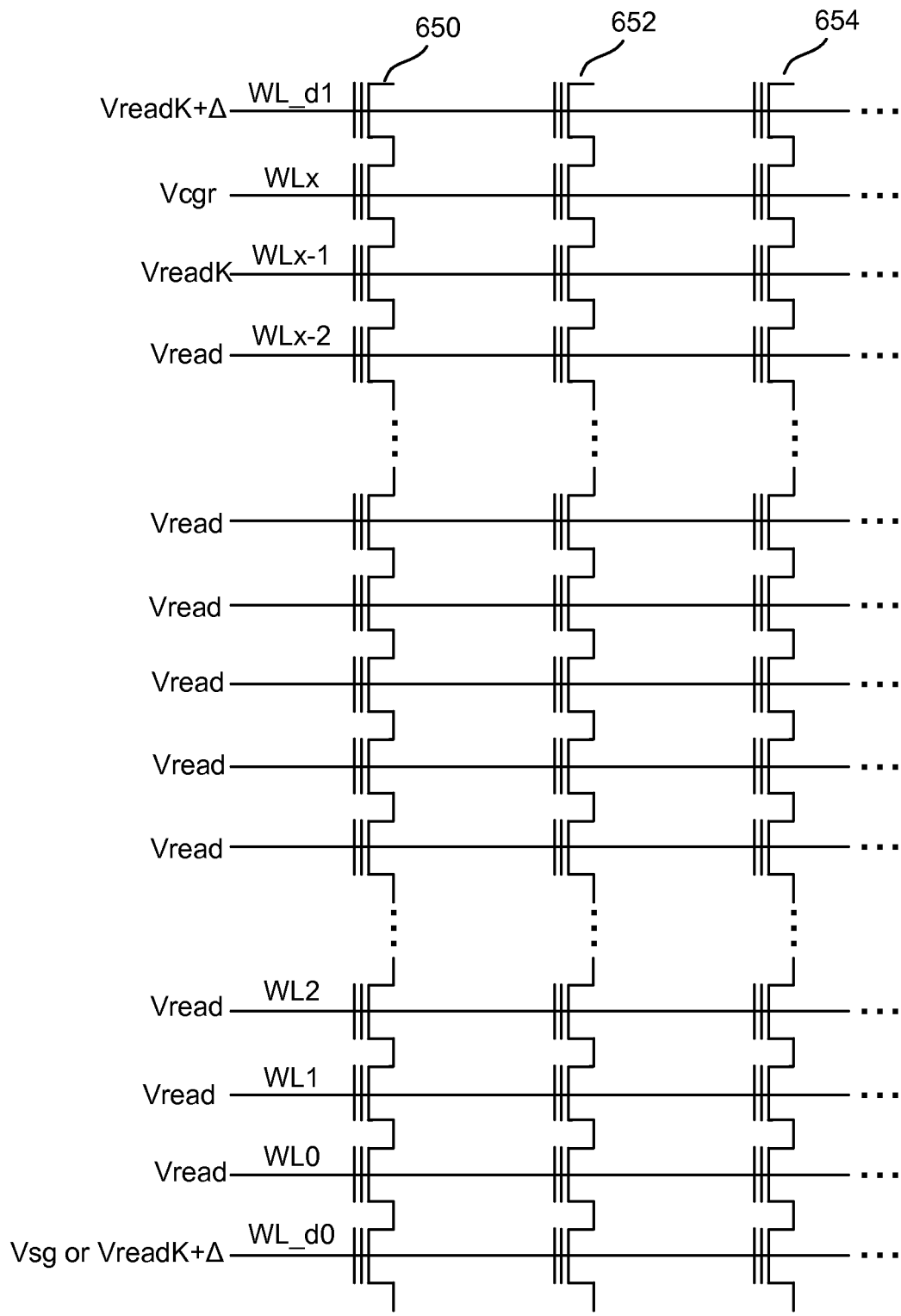

FIG. 27 shows the situation where WLx is selected for reading and, therefore, receives Vcgr. Its neighbor, WLx−1 will receive VreadK. WLx−2 through WL0 will receive Vread. The dummy word line next to the selected word line, WL_d1, will receive VreadK+Δ. The opposite side dummy word line can receive Vsg or VreadK+Δ.

Figure 28:
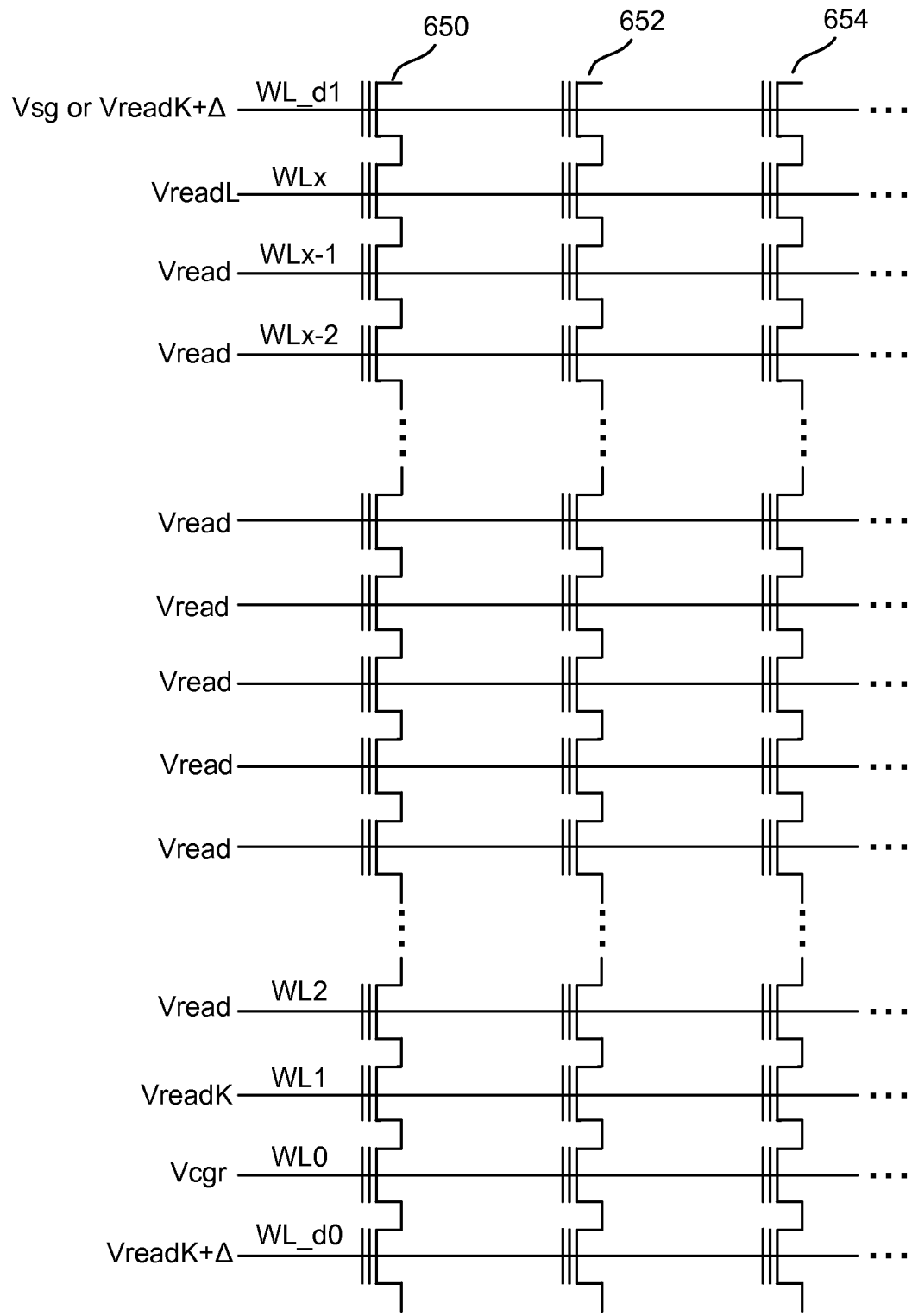

The technique of driving a higher voltage on a dummy word lines when the end word lines are being programmed can be used separate from the technique for using one or more lower read pass voltages for the end word lines or can be used in combination with the technique for using one or more lower read pass voltages for the end word lines. For example, FIG. 28 shows one example embodiment that uses both techniques. In this example, an end word line, WL0 is selected for reading. Therefore, WL0 receives Vcgr. Its adjacent dummy word line, WL_d0 will receive VreadK+Δ. Its neighboring data word line, WL1 will receive VreadK. Word lines WL2-WLx−1 will receive the standard read pass voltage Vread. The end word line on the opposite side of the NAND string, WLx, will receive the lower read pass voltage VreadL. The opposite side dummy word line, WL_d1, can receive Vsg or VreadK+Δ. In other embodiments, the technique for driving a higher voltage on the dummy word lines can be used with any of the other embodiments discussed above including those depicted in FIGS. 16-22 and 24-27.

The above described embodiments show that although end memory cells (or end word lines) receive a lower read pass voltage, a majority of the memory cells (and word lines) for a NAND string receive the standard read pass voltage. In most cases, memory cells (and word lines) on both sides of the memory cell selected for programming receive the standard read pass voltage.

For purposes of clarity, the portion of the NAND string that is at the end of the NAND string can be referred to as an end zone. There will be a first end zone at a first end of a NAND string and a second end zone at a second side of a NAND string. As described above, each end zone can include one, two or three memory cells. In some embodiments, an end zone can include more than three memory cells.

The processes described above can be used as part of a read process or as part of a verify process during programming.

One embodiment includes a method of reading non-volatile storage, comprising: applying a read compare voltage to a selected data memory cell of a NAND string; applying a first set of one or more read pass voltages to one or more unselected data memory cells at a first end of the NAND string and on a first side of the selected data memory cell; and applying a second set of one or more read pass voltages to multiple unselected data memory cells on the NAND string that are on the first side of the selected data memory cell, the second set of one or more read pass voltages are all higher voltages than the first set of one or more read pass voltages.

One embodiment includes a non-volatile storage system, comprising: a plurality of non-volatile storage elements; a plurality of word lines connected to the non-volatile storage elements; and one or more managing circuits in communication with the non-volatile storage elements via the word lines to program and read the non-volatile storage elements. The one or more managing circuits apply a read compare voltage to a selected word line connected to selected data memory cells of a plurality of NAND strings. The one or more managing circuits apply a first set of one or more read pass voltages to one or more unselected word lines connected to unselected data memory cells at a first end of the NAND strings and on a first side of the selected data memory cells. The one or more managing circuits apply a second set of one or more read pass voltages to multiple unselected word lines connected to unselected data memory cells on the NAND strings that are between the selected data memory cells and the unselected data memory cells at the first end of the NAND strings. The second set of one or more read pass voltages are all higher than the first set of one or more read pass voltages.

One embodiment includes a method of reading non-volatile storage, comprising: applying a read compare voltage to a selected data memory cell of a NAND string; applying a first set of one or more read pass voltages to unselected data memory cells at both ends of the NAND string; and applying a second set of one or more read pass voltages to unselected data memory cells between both ends of the NAND string and on both sides of the selected data memory cell, the second set of one or more read pass voltages are all higher than the first set of one or more read pass voltages.

One embodiment includes a method of reading non-volatile storage, comprising: applying a read compare voltage to a selected word line that is connected to selected data memory cells of a plurality of NAND strings, the NAND string is connected to word lines of a block, the block includes dummy word lines; applying a set of one or more read pass voltages to unselected word lines connected to unselected data memory cells of the NAND strings; and applying a higher read pass voltage to dummy word lines when reading data memory cells at extreme ends of the NAND strings, the dummy word lines are connected to dummy cells that are not intended to store user data.

The foregoing detailed description has been presented for purposes of illustration and description. It is not intended to be exhaustive or limiting to the precise form disclosed. Many modifications and variations are possible in light of the above teaching. The described embodiments were chosen in order to best explain the principles of the disclosed technology and its practical application, to thereby enable others skilled in the art to best utilize the technology in various embodiments and with various modifications as are suited to the particular use contemplated. It is intended that the scope be defined by the claims appended hereto.

We claim:

1. A method of reading non-volatile storage, comprising:
    performing a first read process, comprising:
        applying a first read compare voltage to a first selected data memory cell in a middle of a NAND string, the NAND string is connected to a plurality of word lines for a block, the block includes dummy word lines at ends of the NAND string, the dummy word lines are connected to dummy memory cells that do not store user data,
        applying a first set of one or more read pass voltages to one or more unselected data memory cells that are adjacent to the first selected data memory cell,
        applying a second set of one or more read pass voltages to multiple unselected data memory cells on the NAND string that are not adjacent to the first selected data memory cell, the second set of one or more read pass voltages are all lower voltages than the first set of one or more read pass voltages, a majority of unselected data memory cells on the NAND string receive the second set of one or more read pass voltages, and
        applying a dummy word line voltage to a first dummy word line, the dummy word line voltage is lower in magnitude than the second set of one or more read pass voltages; and
    performing a second read process, comprising:
        applying a second read compare voltage to a second selected data memory cell at an end of the NAND string, the second selected data memory cell is adjacent to the first dummy word line, applying a third set of one or more read pass voltages to multiple unselected data memory cells on the NAND string that are not adjacent to the second selected data memory cell, applying a fourth read pass voltage to an unselected memory cell that is adjacent to the second selected memory cell, the fourth read pass voltage is larger in magnitude than the third set of one or more read pass voltages and the second set of one or more read pass voltages, and applying a voltage on the first dummy word line that is higher in magnitude than the fourth read pass voltage.

2. The method of claim 1, wherein:

the first read process further comprises applying a fifth read pass voltage to the data memory cell that is adjacent to the first dummy word line; and the fifth read pass voltage is lower in magnitude than the first set of one or more read pass voltages and the second set of one or more read pass voltages.

3. The method of claim 1, wherein:

the third set of one or more read pass voltages is equal to the second set of one or more read pass voltages;

the fourth read pass voltage is equal to the first set of one or more read pass voltages; and during the second read process, a majority of unselected data memory cells on the NAND string receive the third set of one or more read pass voltages.

4. The method of claim 1, wherein:

the second read process further comprises applying a fifth read pass voltage to a data memory cell that is at a different end of the NAND string and is adjacent to a second dummy word line; and the fifth read pass voltage is lower in magnitude than the third set of one or more read pass voltages.

5. The method of claim 1, wherein:

the first set of one or more read pass voltages includes one read pass voltage; and the second set of one or more read pass voltages includes one read pass voltage.

6. A non-volatile storage system, comprising:

a plurality of memory cells arranged in a plurality of NAND strings;

a plurality of data word lines connected to the non-volatile storage elements;

a dummy word line at a first end of each of the plurality of NAND strings, the dummy word line is connected to dummy memory cells that do not store user data; and one or more managing circuits in communication with the data word lines and the dummy word line as well as the non-volatile storage elements to program and read the non-volatile storage elements, the one or more managing circuits perform a first read process to read data from memory cells in a middle region of the NAND strings and perform a second read process to read data from memory cells at an end of the NAND strings adjacent to the dummy word line, when performing the first read process, the one or more managing circuits apply a first read compare voltage to a first selected word line connected to first selected data memory cells of a plurality of NAND strings, apply a first set of one or more read pass voltages to one or more unselected word lines connected to unselected data memory cells adjacent to the first selected data memory cells, and apply a second set of one or more read pass voltages to multiple unselected word lines connected to unselected data memory cells that are not adjacent to the first selected data memory cells, the second set of one or more read pass voltages are all lower than the first set of one or more read pass voltages, when performing the second read process, the one or more managing circuits apply a second read compare voltage to a second selected word line connected to second selected data memory cells at the end of the NAND strings, apply a third set of one or more read pass voltages to unselected word lines connected to multiple unselected data memory cells on the NAND strings that are not adjacent to the second selected data memory cells, apply a fourth read pass voltage to an unselected word line connected to unselected memory cells that are adjacent to the second selected memory cells such that the fourth read pass voltage is larger in magnitude than the third set of one or more read pass voltages, and apply a voltage on the dummy word line that is higher in magnitude than the fourth read pass voltage.

7. The non-volatile storage system of claim 6, wherein:

during the first read process, a majority of the word lines receive the second set of one or more read pass voltages; and during the second read process, a majority of the word lines receive the third set of one or more read pass voltages.

8. The non-volatile storage system of claim 6, wherein:

during the first read process the one or more managing circuits apply a fifth read pass voltage to the word line that is connected to memory cells at the end of the NAND strings; and the fifth read pass voltage is lower in magnitude than the first set of one or more read pass voltages and the second set of one or more read pass voltages.

9. The non-volatile storage system of claim 6, wherein:

during the second read process the one or more managing circuits apply a fifth read pass voltage to a word line at a different end of the NAND string than the dummy word line; and the fifth read pass voltage is lower in magnitude than the third set of one or more read pass voltages and the fourth read pass voltage.

10. A method of reading non-volatile storage, comprising:

applying read compare voltages to selected word lines that are connected to selected data memory cells of a plurality of NAND strings, the plurality of NAND strings connected to word lines of a block, the block includes a dummy word line at end of the NAND strings, the dummy word line is connected to dummy memory cells that do not store user data;

applying a first set of one or more read pass voltages to a majority of unselected word lines that are connected to unselected data memory cells of the NAND strings;

applying a first higher read pass voltage to unselected word lines adjacent to selected word lines, the first higher read pass voltage is higher in magnitude than the first set of one or more read pass voltages; and applying a second higher read pass voltage to the dummy word line when reading data memory cells at an extreme end of the NAND strings, the second higher read pass voltage is higher in magnitude than the first higher read pass voltage.

11. The method of claim 10, further comprising:

applying an end word line voltage to a word line at an end of the NAND strings, the end word line voltage is lower in magnitude than the first set of one or more read pass voltage.

12. A non-volatile storage system, comprising:

a plurality of data memory cells arranged in a plurality of NAND strings;

a plurality of data word lines connected to the plurality of NAND strings;

a dummy word line at a first end of each of the plurality of NAND strings, the dummy word line is connected to dummy memory cells that do not store user data, the plurality of data word lines include a first data word line adjacent to the dummy word line; and one or more managing circuits in communication with the data word lines and the dummy word line, the one or more managing circuits apply a first set of one or more read pass voltages to a majority of unselected word lines that are connected to unselected data memory cells of the NAND strings during read processes, the one or more managing circuits apply adjacent read pass voltages to data word lines that are adjacent to selected word lines during read processes, the adjacent read pass voltages are higher in magnitude than the first set of one or more read pass voltages, the one or more managing circuits apply a first dummy word line voltage to the dummy word line during read processes for memory cells on the first data word line and apply a second dummy word line voltage to the dummy word line during read processes for memory cells on data word lines other than the first data word line, the first dummy word line voltage is higher in magnitude than the adjacent read pass voltages, the second dummy word line voltage is lower in magnitude than the a first set of one or more read pass voltages.

* * * * *